US012796073B2

(12) United States Patent
Park et al.

(10) Patent No.: US 12,796,073 B2
(45) Date of Patent: Nov. 10, 2026

(54) THREE-DIMENSIONAL SEMICONDUCTOR DEVICE

(71) Applicant: Samsung Electronics Co., Ltd., Suwon-si (KR)

(72) Inventors: Jisoo Park, Suwon-si (KR); Jung Han Lee, Suwon-si (KR); Kwanyoung Chun, Suwon-si (KR); Kwangmuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 18/659,726

(22) Filed: May 9, 2024

(65) Prior Publication Data

US 2025/0142956 A1 May 1, 2025

(30) Foreign Application Priority Data

Oct. 30, 2023 (KR) ........................ 10-2023-0147193

(51) Int. Cl.

| | |
|---|---|
| ***H10D 84/85*** | (2025.01) |
| ***H10D 62/10*** | (2025.01) |
| ***H10D 88/00*** | (2026.01) |
| ***H10W 20/41*** | (2026.01) |
| *H10D 84/03* | (2025.01) |

(52) U.S. Cl.

CPC ......... *H10D 84/851* (2025.01); *H10D 62/121* (2025.01); *H10D 88/00* (2025.01); *H10W 20/427* (2026.01); *H10D 84/038* (2025.01)

(58) Field of Classification Search

CPC .... H10D 84/851; H10D 62/121; H10D 88/00; H10W 20/427

See application file for complete search history.

(56) References Cited

U.S. PATENT DOCUMENTS

| | | | |
|---|---|---|---|
| 10,770,479 B2 | 9/2020 | Smith et al. | |
| 10,833,078 B2 | 11/2020 | Smith et al. | |
| 11,063,045 B2 | 7/2021 | Wu et al. | |
| 2022/0109047 A1 | 4/2022 | Jun et al. | |
| 2022/0344481 A1 | 10/2022 | Hong et al. | |
| 2023/0067311 A1 | 3/2023 | Lai et al. | |
| 2023/0163185 A1 * | 5/2023 | Fulford .................. | H10D 88/00 257/233 |

* cited by examiner

*Primary Examiner* — Peter M Albrecht
(74) *Attorney, Agent, or Firm* — Muir Patent Law, PLLC

(57) ABSTRACT

Disclosed is a three-dimensional semiconductor device comprising a substrate including first and second regions, a first active section on the first region and including a first lower channel pattern and a first lower source/drain pattern, a second active section on the first active section and including a first upper channel pattern and a first upper source/drain pattern, a third active section on the second region and including a second lower channel pattern and a second lower source/drain pattern, a fourth active section on the third active section and including a second upper channel pattern and a second upper source/drain pattern, and a gate electrode on the first and second lower channel patterns and the first and second upper channel patterns. A first width in a first direction of the first lower channel pattern is greater than a second width in the first direction of the second lower channel pattern.

20 Claims, 26 Drawing Sheets

THREE-DIMENSIONAL SEMICONDUCTOR DEVICE

CROSS-REFERENCE TO RELATED APPLICATION

This U.S. nonprovisional application claims priority under 35 U.S.C § 119 to Korean Patent Application No. 10-2023-0147193 filed on Oct. 30, 2023, in the Korean Intellectual Property Office, the disclosure of which is hereby incorporated by reference in its entirety.

BACKGROUND

The present inventive concepts relate to a three-dimensional semiconductor device, and more particularly, to a three-dimensional semiconductor device including a field effect transistor.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some embodiments of the present inventive concepts provide a three-dimensional semiconductor device having increased integration and improved electrical properties.

According to some embodiments of the present inventive concepts, a three-dimensional semiconductor device may comprise: a substrate that includes a first region and a second region; a first active section on the first region, wherein the first active section includes a first lower channel pattern and a first lower source/drain pattern connected to the first lower channel pattern; a second active section on the first active section, wherein the second active section includes a first upper channel pattern and a first upper source/drain pattern connected to the first upper channel pattern; a third active section on the second region, wherein the third active section includes a second lower channel pattern and a second lower source/drain pattern connected to the second lower channel pattern; a fourth active section on the third active section, wherein the fourth active section includes a second upper channel pattern and a second upper source/drain pattern connected to the second upper channel pattern; and a gate electrode on the first and second lower channel patterns and the first and second upper channel patterns. A first width in a first direction of the first lower channel pattern may be greater than a second width in the first direction of the second lower channel pattern.

According to some embodiments of the present inventive concepts, a three-dimensional semiconductor device may comprise: a first active section on a substrate, wherein the first active section includes a first lower channel pattern, a second lower channel pattern horizontally spaced apart from the first lower channel pattern, a first lower source/drain pattern connected to the first lower channel pattern, and a second lower source/drain pattern connected to the second lower channel pattern; a second active section on the first active section, wherein the second active section includes a first upper channel pattern, a second upper channel pattern horizontally spaced apart from the first upper channel pattern, a first upper source/drain pattern connected to the first upper channel pattern, and a second upper source/drain pattern connected to the second upper channel pattern; a gate electrode on the first and second lower channel patterns and the first and second upper channel patterns; a lower active contact electrically connected to the first and second lower source/drain patterns; and a first upper active contact electrically connected to the first and second upper source/drain patterns. The first upper active contact may have a bar shape that extends in a first direction. A width in the first direction of the first upper active contact may be greater than a maximum width of each of the first and second upper source/drain patterns.

According to some embodiments of the present inventive concepts, a three-dimensional semiconductor device may comprise: a substrate that includes a first region, a second region, and a third region; a first single height cell on the first region, wherein the first single height cell includes a first active section and a second active section stacked on the first active section; a plurality of second single height cells on the second region and a dummy region between the plurality of second single height cells, wherein each of the plurality of second single height cells includes a third active section and a fourth active section stacked on the third active section; a double height cell on the third region, wherein the double height cell includes a fifth active section and a sixth active section stacked on the fifth active section; a plurality of first gate electrodes on the first and second active sections, wherein each of the plurality of first gate electrodes has a bar shape that extends in a first direction; a first upper active contact between the plurality of first gate electrodes, wherein the first upper active contact has a bar shape that extends in the first direction; a plurality of second gate electrodes on the third and fourth active sections, wherein each of the plurality of second gate electrodes has a bar shape that extends in the first direction; a second upper active contact between the plurality of second gate electrodes, wherein the second upper active contact has a bar shape that extends in the first direction; a plurality of third gate electrodes on the fifth and sixth active sections, wherein each of the plurality of third gate electrodes has a bar shape that extends in the first direction; and a third upper active contact between the plurality of third gate electrodes, wherein the third upper active contact has a bar shape that extends in the first direction. A first height in the first direction of the first single height cell may be in the range of 1.5 times to 2.5 times a second height in the first direction of the second single height cell.

DETAILED DESCRIPTION OF EMBODIMENTS

The present disclosure now will be described more fully hereinafter with reference to the accompanying drawings, in which various embodiments are shown. The invention may, however, be embodied in many different forms and should not be construed as limited to the example embodiments set forth herein. It should also be emphasized that the disclosure provides details of alternative examples, but such listing of alternatives is not exhaustive. Furthermore, any consistency of detail between various examples should not be interpreted as requiring such detail. The language of the claims should be referenced in determining the requirements of the invention.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

Figure 1A:
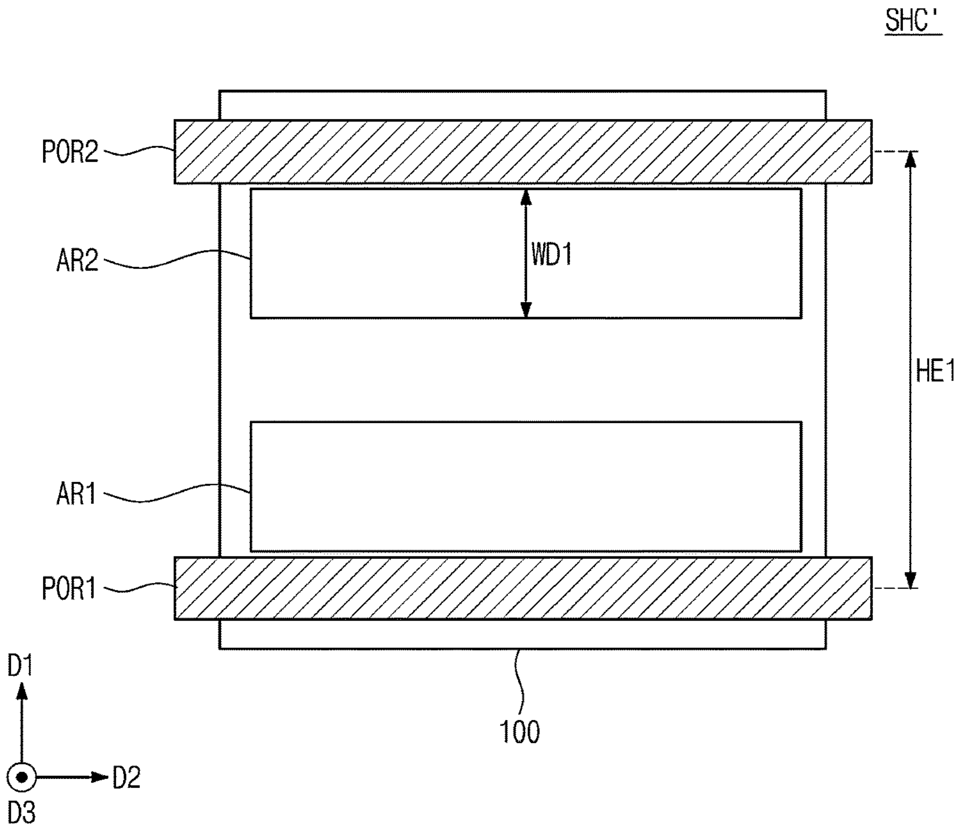
FIG. 1A illustrates a conceptual diagram showing a logic cell of a semiconductor device according to a comparative example of the present inventive concepts.

FIG. 1A illustrates a conceptual diagram showing a logic cell of a semiconductor device according to a comparative example for comparison with the present inventive concepts. FIG. 1A depicts a logic cell of a two-dimensional device according to the comparative example.

Referring to FIG. 1A, a single height cell SHC' may be provided. For example, a substrate 100 may be provided thereon with a first power line POR1 and a second power line POR2. One of the first and second power lines POR1 and POR2 may be provided with a drain voltage (VDD) or a power voltage. The other of the first and second power lines POR1 and POR2 may be provided with a source voltage (VSS) or a ground voltage. For example, the source voltage (VSS) may be applied to the first power line POR1, and the drain voltage (VDD) may be applied to the second power line POR2.

The single height cell SHC' may be defined between the first power line POR1 and the second power line POR2. The single height cell SHC' may include a first active section AR1 and a second active section AR2. One of the first and second active sections AR1 and AR2 may be a PMOSFET region, and the other of the first and second active sections AR1 and AR2 may be an NMOSFET region. For example, the first active section AR1 may be an NMOSFET region, and the second active section AR2 may be a PMOSFET region. For example, the single height cell SHC' may have a complementary metal oxide semiconductor (CMOS) structure provided between the first power line POR1 and the second power line POR2.

A semiconductor device according to the comparative example may be a two-dimensional device in which transistors of front-end-of-line (FEOL) layer are arranged two-dimensionally. For example, NMOSFETs on the first active section AR1 may be formed spaced apart in a first direction D1 from PMOSFETs on the second active section AR2.

Each of the first and second active sections AR1 and AR2 may have a first distance WD1 in the first direction D1. A first length HE1 may be defined as a length in the first direction D1 of the single height cell SHC' according to the comparative example. The first length HE1 may be the same as a distance (e.g., pitch) between the first power line POR1 and the second power line POR2.

Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The single height cell SHC' may constitute one logic cell. In this description, the logic cell may mean a logic device (e.g., AND, OR, XOR, XNOR, and inverter) that performs a specific function. For example, the logic cell may include transistors for constituting a logic device, and may also include wiring lines that electrically connect the transistors to each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Elements described as being "electrically connected" are configured such that an electrical signal can be passed from one element to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, elements that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Because a two-dimensional device is included in the single height cell SHC' according to the comparative example, the first active section AR1 and the second active section AR2 may be disposed spaced apart from each other in the first direction D1 without overlapping each other. Therefore, it may be required that the first length HE1 of the single height cell SHC' be sufficient to include all of the first and second active sections AR1 and AR2 that are spaced apart from each other in the first direction D1. As a result, the first length HE1 of the single height cell SHC' according to the comparative example may be required to be relatively large. Therefore, the single height cell SHC' according to the comparative example may have a relatively large area.

Figure 1B:
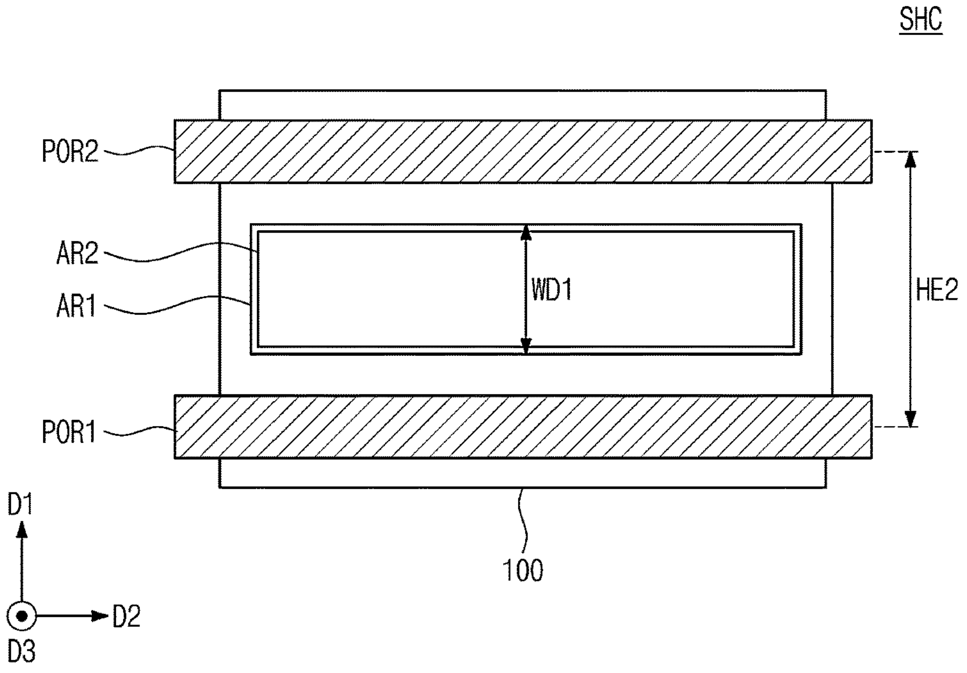
FIGS. 1B and 2 illustrate cross-sectional views showing conceptual diagram showing a logic cell of a semiconductor device according to some embodiments of the present inventive concepts.
Figure 2:
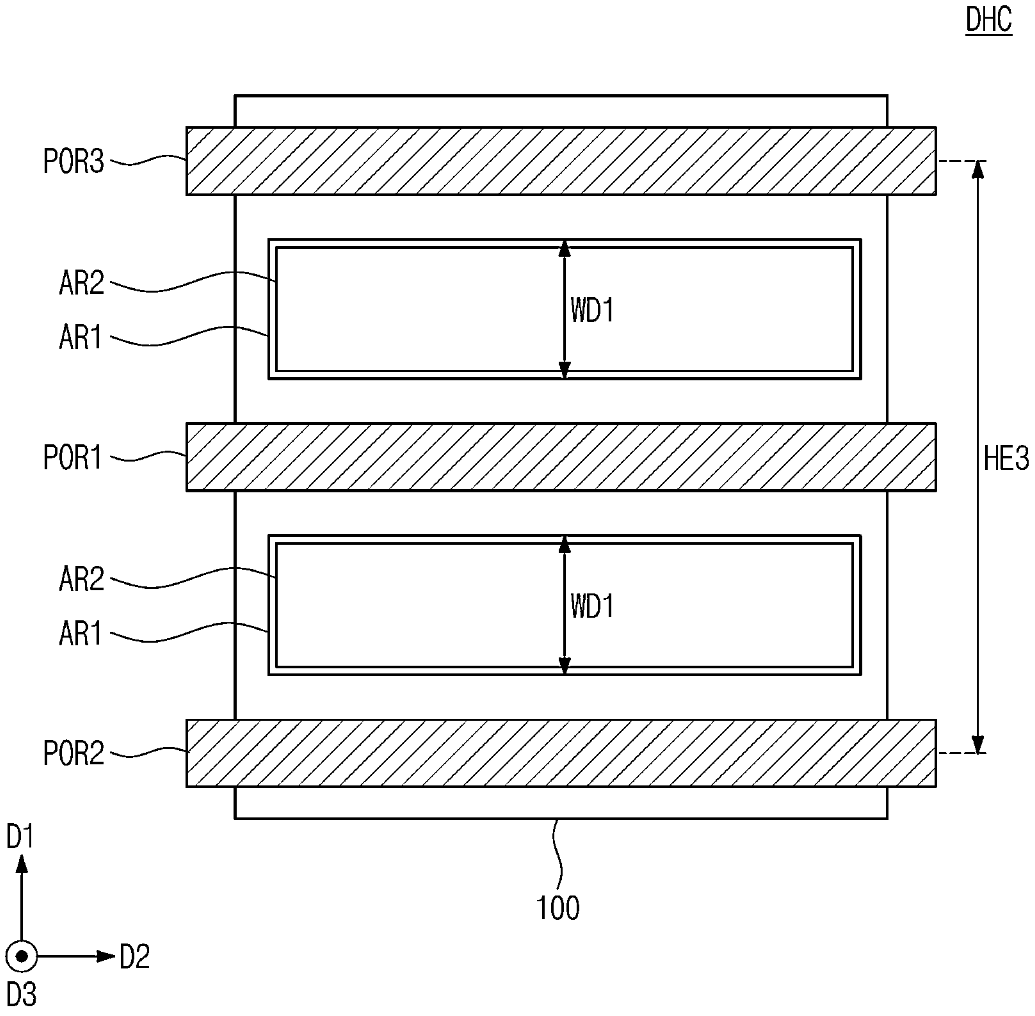

FIG. 1B and FIG. 2 illustrate conceptual diagrams showing a logic cell of a semiconductor device according to some embodiments of the present inventive concepts. FIG. 1B and FIG. 2 depict a logic cell of a three-dimensional device according to some embodiments of the present inventive concepts.

Referring to FIG. 1B, a single height cell SHC may be provided which includes a three-dimensional device such as a stacked transistor. For example, a substrate 100 may be provided thereon with a first power line POR1 and a second power line POR2. The single height cell SHC may be defined between the first power line POR1 and the second power line POR2.

The single height cell SHC may include a first active section AR1 and a second active section AR2. One of the first and second active sections AR1 and AR2 may be a PMOSFET region, and the other of the first and second active sections AR1 and AR2 may be an NMOSFET region.

A semiconductor device according to some embodiments may be a three-dimensional device in which transistors of a front-end-of-line (FEOL) layer are stacked vertically. The substrate 100 may be provided thereon with the first active section AR1 as a bottom tier, and the first active section AR1 may be provided thereon with the second active section AR2 as a top tier. For example, the substrate 100 may be provided thereon with NMOSFETs of the first active section AR1, and PMOSFETs of the second active section AR2 may be stacked on the NMOSFETs. The first active section AR1 and the second active section AR2 may be spaced apart from each other in a vertical direction or a third direction D3.

Each of the first and second active sections AR1 and AR2 may have a first distance WD1 in the first direction D1. A second length HE2 may be defined as a length in the first direction D1 of the single height cell SHC according to the present embodiment.

Because the single height cell SHC according to the present embodiment includes a three-dimensional device such as a stacked transistor, the first active section AR1 and the second active section AR2 may overlap each other in the vertical direction or the third direction. Therefore, the second length HE2 of the single height cell SHC may only require a length sufficient to cover the first distance WD1 whereas the first length HE1 of the comparative example of FIG. 1A may be required to have a length sufficient to cover the first distance WD1 of both the first active section AR1 and the second active section AR2. As a result, the second length HE2 of the single height cell SHC according to the present embodiment may be less than the first length HE1 of the single height cell SHC' discussed above in FIG. 1A. The single height cell SHC according to the present embodiment may have a relatively small area compared the comparative example of FIG. 1A. For a three-dimensional semiconductor device according to the present embodiment, an area of a logic cell may be reduced and the integration of the device may be increased as a result.

Referring to FIG. 2, a double height cell DHC may be provided. For example, a substrate 100 may be provided thereon with a first power line POR1, a second power line POR2, and a third power line POR3. The first power line POR1 may be disposed between the second power line POR2 and the third power line POR3. The third power line POR3 may be a pathway to which a source voltage (VSS) is provided.

The double height cell DHC may be defined between the second power line POR2 and the third power line POR3. The double height cell DHC may include two first active sections AR1 and two second active sections AR2.

A semiconductor device according to the present embodiment may be a three-dimensional device in which transistors of a front-end-of-line (FEOL) layer are stacked vertically. The substrate 100 may be provided thereon with the first active sections AR1 as a bottom tier, and the first active sections AR1 may be correspondingly provided thereon with the second active sections AR2 as a top tier. The first active sections AR1 and the second active sections AR2 may be spaced apart from each other in the vertical direction or the third direction D3.

The first active sections AR1 and the second active sections AR2 may each have a first distance WD1 in the first direction D1. The double height cell DHC according to the present embodiment may have a third length HE3 in the first direction D1. The third length HE3 may be the same as a distance between the second power line POR2 and the third power line POR3. The third length HE3 may be about twice the second length HE2 of FIG. 1B. The two first active sections AR1 of the double height cell DHC may be collectively connected to act as one active section.

In the present inventive concepts, the double height cell DHC shown in FIG. 2 may be defined as a multi-height cell. Although not shown, the multi-height cell may include a triple height cell whose cell length is about three times that of the single height cell SHC.

Figure 3:
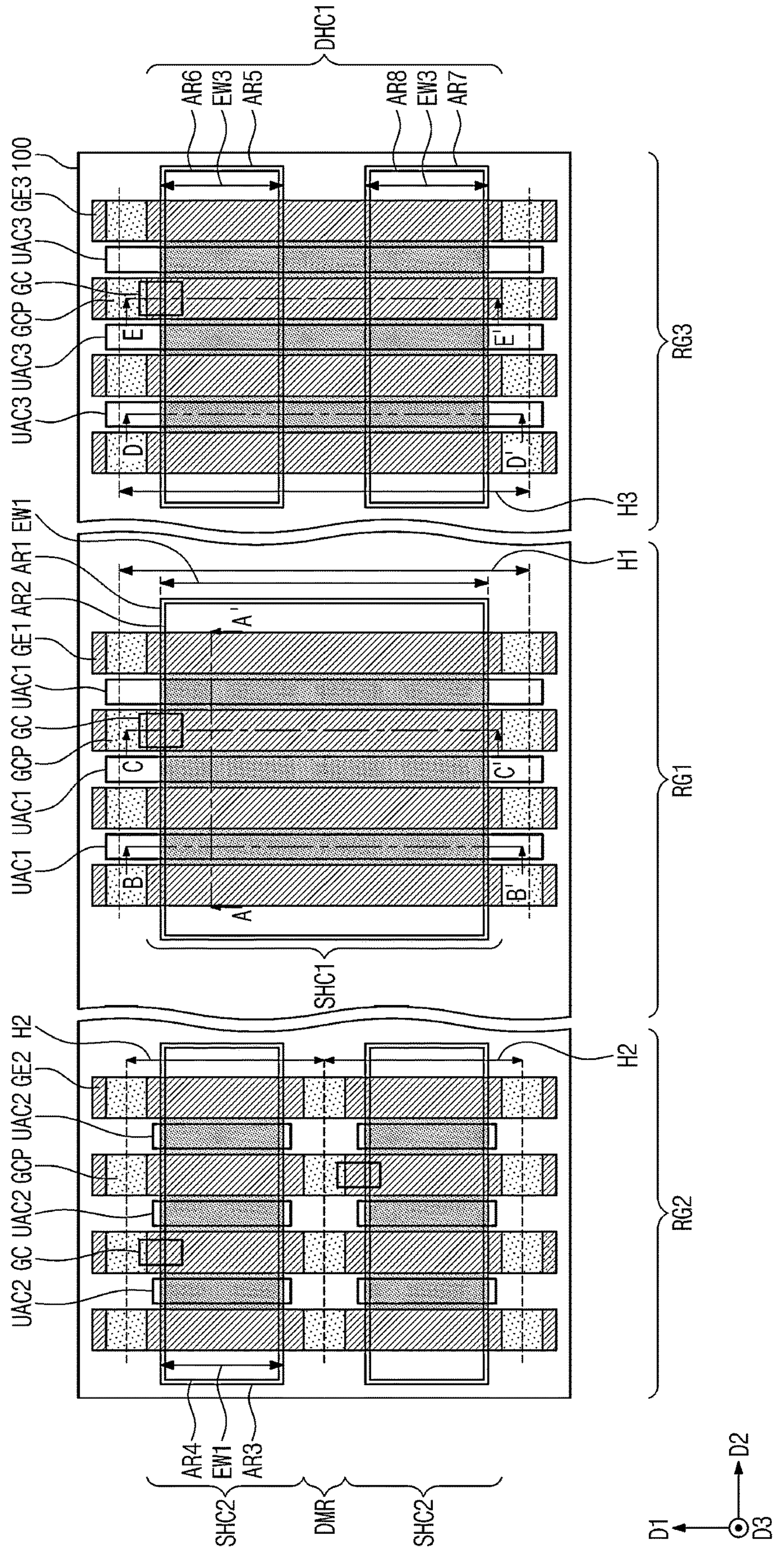
FIG. 3 illustrates a plan view of a three-dimensional semiconductor device according to some embodiments of the present inventive concepts.

FIG. 3 is a plan view illustrating a three-dimensional semiconductor device according to some embodiments of the present inventive concepts. FIGS. 4A, 4B, 4C, 4D, and 4E are cross-sectional views respectively taken along lines A-A', B-B', C-C', D-D', and E-E' of FIG. 3. The three-dimensional semiconductor device shown in FIGS. 3 and 4A to 4C may include a detailed example of a single height cell. The three-dimensional semiconductor device shown in FIGS. 3, 4D, and 4E may include a detailed example of a double height cell.

Referring to FIG. 3, a substrate 100 may be provided which includes a first region RG1, a second region RG2, and a third region RG3. The substrate 100 may be a compound semiconductor substrate or a semiconductor substrate formed of and/or including silicon, germanium, or silicon-germanium. For example, the substrate 100 may be a silicon substrate.

In an embodiment of the present inventive concepts, the first region RG1, the second region RG2, and the third region RG3 may each be a cell region on which are disposed logic cells included in a logic circuit. The first, second, and third regions RG1, RG2, and RG3 may include logic devices (e.g., AND, OR, XOR, XNOR, and inverter) with each being provided to coincide with a designed layout and perform a specific function. The first, second, and third regions RG1, RG2, and RG3 may be provided on the semiconductor device with a single height cell, a double height cell, or a combination thereof and are disposed in coincidence with the layout.

A first single height cell SHC1 may be provided in the first region RG1. A first height H1 may be defined as a length in a first direction D1 of the first single height cell SHC1. The first height H1 may be greater than a first region width EW1 in the first direction D1 of each of first and second active sections AR1 and AR2. The first height H1 may be greater than a second height H2 which will be discussed below. For example, the first height H1 may be in the range of 1.5 times to 2.5 times the second height H2.

Second single height cells SHC2 may be provided in the second region RG2. Each of the second single height cells SHC2 may correspond to the single height cell SHC of FIG. 1B. The second single height cells SHC2 may be spaced apart from each other in the first direction D1. A second height H2 may be defined as a length in the first direction D1 of the second single height cell SHC2. The second height H2 may be greater than a second region width EW2 in the first direction D1 of each of third and fourth active sections AR3 and AR4. A dummy region DMR may be disposed between the second single height cells SHC2.

As used herein, the term "dummy" is used to refer to a component that has the same or similar structure and shape as another component but does not have the same substantial function as the other component and may exist only as a pattern in the device. For example, a dummy component may not contribute to a logic function in a logic circuit.

A first double height cell DHC1 may be provided in the third region RG3. The first double height cell DHC1 may correspond to the double height cell DHC of FIG. 2. A third height H3 may be defined as a length in the first direction D1 of the first double height cell DHC1. The third height H3 may be greater than a third region width EW3 in the first direction D1 of each of fifth and sixth active sections AR5 and AR6. The third height H3 may be greater than the second height H2 and equal to the first height H1. Alternatively, the third height H3 may be less than the first height H1.

In some embodiments of the present inventive concepts, the first, second, and third regions RG1, RG2, and RG3 may have provided thereon a first and a second single height cells SHC1 and SHC2, a first double height cell DHC1, or a combination thereof. For example, a transistor of the first single height cell SHC1 on the first region RG1 may be an extra gate (EG) device, and a transistor of the second single height cell SHC2 on the second region RG2 may be a single gate (SG) device. In another example, a transistor on the first region RG1 may include a long gate transistor (or long channel transistor) having a gate length (or channel length) that is relatively large. The first region RG1 may include a transistor having a relatively large effective channel width or effective nano-sheet width.

A three-dimensional transistor of the first region RG1 will be discussed in detail below with reference to FIGS. 3 and 4A to 4C. The first single height cell SHC1 may be provided on the substrate 100. The substrate 100 may have a first surface 100*a* and a second surface 100*b* that are opposite to each other. The first surface 100*a* may be a front surface of the substrate 100, and the second surface 100*b* may be a rear surface of the substrate 100. In an embodiment of the present inventive concepts, the substrate 100 may be a semiconductor substrate formed of and/or including silicon, germanium, or silicon germanium. In another embodiment of the present inventive concepts, the substrate 100 may be a dielectric substrate formed of and/or including a silicon-based dielectric material (e.g., silicon oxide and/or silicon nitride).

The first single height cell SHC1 may function as a logic cell and may include a first active section AR1 and a second active section AR2 that are sequentially stacked on the substrate 100. One of the first and second active sections AR1 and AR2 may be a PMOSFET region, and the other of the first and second active sections AR1 and AR2 may be an NMOSFET region. The first active section AR1 may be provided on a bottom tier of a front-end-of-line (FEOL) layer, and the second active section AR2 may be provided on a top tier of the front-end-of-line (FEOL) layer. An NMOSFET and a PMOSFET of the first and second active sections AR1 and AR2 may be vertically stacked to constitute a three-dimensional stacked transistor. In an embodiment, the first active section AR1 may be an NMOSFET region, and the second active section AR2 may be a PMOSFET region.

An active pattern AP may be defined by a trench formed at an upper portion of the substrate 100. The active pattern AP may be a vertically protruding portion of the substrate 100. The active pattern AP may be provided thereon with the first and second active sections AR1 and AR2 that are sequentially stacked.

A device isolation layer ST may fill the trench. The device isolation layer ST may define a first single height cell SHC1. When viewed in a plan view, the first single height cell SHC1 may be defined between device isolation layers ST that neighbor one another in the first direction D1. The device isolation layer ST may have a top surface coplanar with or lower than that of a top surface of the active pattern AP. The device isolation layer ST may not cover any of a first lower channel pattern LCH1 and a first upper channel pattern UCH1 which will be discussed below. The device isolation layer ST may be formed of and/or include a silicon-based dielectric material (e.g., silicon oxide, silicon nitride, or silicon oxynitride).

The active pattern AP may have provided thereon the first active section AR1 including first lower channel patterns LCH1 and first lower source/drain patterns LSD1. The first lower channel pattern LCH1 may be interposed between a pair of first lower source/drain patterns LSD1. The first lower channel pattern LCH1 may connect the pair of first lower source/drain patterns LSD1 to each other.

The first lower channel pattern LCH1 may include a first semiconductor pattern SP1 and a second semiconductor pattern SP2 that are stacked while being spaced apart from each other. Each of the first and second semiconductor patterns SP1 and SP2 may be formed of and/or include silicon (Si), germanium (Ge), or silicon-germanium (SiGe). For example, each of the first and second semiconductor patterns SP1 and SP2 may be formed of and/or include crystalline silicon. Each of the first and second semiconductor patterns SP1 and SP2 may be a nano-sheet. The first lower channel pattern LCH1 may further include one or more semiconductor patterns that are stacked while being spaced apart from the second semiconductor pattern SP2.

The first lower source/drain patterns LSD1 may be provided at a top surface of a lower active contact LAC which will be discussed below. Each of the first lower source/drain patterns LSD1 may be an epitaxial pattern formed by a selective epitaxial growth (SEG) process. For example, a top surface of the first lower source/drain pattern LSD1 may be higher than that of the second semiconductor pattern SP2 of the first lower channel pattern LCH1.

The first lower source/drain patterns LSD1 may be doped with impurities to have a first conductivity type. The first conductivity type may be of n-type or p-type. In the present embodiment, the first conductivity type may be of n-type. The first lower source/drain patterns LSD1 may be formed of and/or include one or more of silicon (Si) and silicon-germanium (SiGe).

A first interlayer dielectric layer 110 may be provided on the first lower source/drain pattern LSD1. The first interlayer dielectric layer 110 may cover the first lower source/drain patterns LSD1.

A lower active contact LAC may be provided below the first lower source/drain pattern LSD1. The lower active contact LAC may be electrically connected to the first lower source/drain pattern LSD1. The lower active contact LAC may be buried in the substrate 100. The lower active contact LAC may vertically extend from the second surface 100*b* of the substrate 100 to the first surface 100*a* of the substrate 100. The lower active contact LAC may be formed of and/or include metal selected from copper (Cu), aluminum (Al), ruthenium (Ru), cobalt (Co), tungsten (W), and molybdenum (Mo). The lower active contact LAC may be covered with the first interlayer dielectric layer 110.

The lower active contact LAC may include a horizontal part that extends in the first direction D1 and a protrusion part in contact with a corresponding one of first, second, and third lower source/drain patterns LSD1, LSD2, and LSD3 which will be discussed below. A width in the first direction D1 of the horizontal part may be greater than a maximum width in the first direction D1 of each of the first, second, and third lower source/drain patterns LSD1, LSD2, and LSD3.

The first interlayer dielectric layer 110 may be provided thereon with a second interlayer dielectric layer 120 and a second active section AR2. The second active section AR2 may include first upper channel patterns UCH1 and first upper source/drain patterns USD1. The first upper channel patterns UCH1 may correspondingly vertically overlap the first lower channel patterns LCH1. The first upper source/drain patterns USD1 may correspondingly vertically overlap the first lower source/drain patterns LSD1. The first upper channel pattern UCH1 may be interposed between a pair of first upper source/drain patterns USD1. The first upper channel pattern UCH1 may connect the pair of first upper source/drain patterns USD1 to each other.

The first upper channel pattern UCH1 may include a third semiconductor pattern SP3 and a fourth semiconductor pattern SP4 that are stacked while being spaced apart from each other. The third and fourth semiconductor patterns SP3 and SP4 of the first upper channel pattern UCH1 may include the same semiconductor material as that of the first and second semiconductor patterns SP1 and SP2 of the first lower channel pattern LCH1. Each of the third and fourth semiconductor patterns SP3 and SP4 may be a nano-sheet. For example, the first upper channel pattern UCH1 may further include one or more semiconductor patterns that are stacked while being spaced apart from the fourth semiconductor pattern SP4.

At least one dummy channel pattern DSP may be interposed between the first lower channel pattern LCH1 and the first upper channel pattern UCH1 that overlies the first lower channel pattern LCH1. A seed layer SDL may be interposed between the dummy channel pattern DSP and the first upper channel pattern UCH1.

The dummy channel pattern DSP may be spaced apart from the first lower and upper source/drain patterns LSD1 and USD1. For example, the dummy channel pattern DSP may not be connected to any source/drain pattern. The dummy channel pattern DSP may be formed of and/or include a semiconductor material such as silicon (Si), germanium (Ge), or silicon-germanium (SiGe), or a silicon-based dielectric material such as silicon oxide or silicon nitride. In an embodiment of the present inventive concepts, the dummy channel pattern DSP may include a silicon-based dielectric material.

The first upper source/drain patterns USD1 may be provided at a top surface of the first interlayer dielectric layer 110. Each of the first upper source/drain patterns USD1 may be an epitaxial pattern formed by a selective epitaxial growth (SEG) process. For example, a top surface of the first upper source/drain pattern USD1 may be higher than that of the fourth semiconductor pattern SP4 of the first upper channel pattern UCH1.

The first upper source/drain patterns USD1 may be doped with impurities to have a second conductivity type. The second conductivity type may be different from the first conductivity type of the first lower source/drain pattern LSD1. The second conductivity type may be of p-type. The first upper source/drain patterns USD1 may be formed of and/or include one or more of silicon-germanium (SiGe) and silicon (Si).

Referring back to FIG. 3, a plurality of first gate electrodes GE1 may be provided in the first single height cell SHC1 on the first region RG1. For example, the first gate electrode GE1 may be provided on the first lower and upper channel patterns LCH1 and UCH1 that are stacked. When viewed in plan, the first gate electrode GE may have a bar shape that extends in the first direction D1. The first gate electrode GE1 may vertically overlap the stacked first lower and upper channel patterns LCH1 and UCH1.

The first gate electrode GE1 may extend in a vertical direction (e.g., a third direction D3) to the gate capping pattern GP from the top surface of the device isolation layer ST (or the top surface of the active pattern AP). The first gate electrode GE1 may extend in the third direction D3 from the first lower channel pattern LCH1 of the first active section AR1 to the first upper channel pattern UCH1 of the second active section AR2. The first gate electrode GE1 may extend in the third direction D3 from a lowermost first semiconductor pattern SP1 to an uppermost fourth semiconductor pattern SP4.

The first gate electrode GE1 may be provided at a top surface, a bottom surface, and opposite sidewalls of each of the first to fourth semiconductor patterns SP1 to SP4. In this sense, a transistor according to the present embodiment may be a three-dimensional field effect transistor (e.g., MBCFET or GAAFET) in which the first gate electrode GE1 three-dimensionally surrounds a channel.

The first gate electrode GE1 may include a lower gate electrode LGE provided in a bottom tier of a front-end-of-line (FEOL) layer or in the first active section AR1, and may also include an upper gate electrode UGE provided in a top tier of the FEOL layer or in the second active section AR2. The lower gate electrode LGE and the upper gate electrode UGE may vertically overlap each other. In an embodiment of the present inventive concepts, the lower gate electrode LGE and the upper gate electrode UGE may be connected to each other. For example, the first gate electrode GE1 according to the present embodiment may be a common gate electrode in which the lower gate electrode LGE on the first lower channel pattern LCH1 is connected to the upper gate electrode UGE on the first upper channel pattern UCH1.

The lower gate electrode LGE may include a first inner electrode PO1 interposed between the active pattern AP and the first semiconductor pattern SP1, a second inner electrode PO2 interposed between the first semiconductor pattern SP1 and the second semiconductor pattern SP2, and a third inner electrode PO3 interposed between the second semiconductor pattern SP2 and the dummy channel pattern DSP.

The upper gate electrode UGE may include a fourth inner electrode PO4 interposed between the dummy channel pattern DSP (or the see layer SDL) and the third semiconductor pattern SP3, a fifth inner electrode PO5 interposed between the third semiconductor pattern SP3 and the fourth semiconductor pattern SP4, and an outer electrode PO6 on the fourth semiconductor pattern SP4.

A pair of gate spacers GS may be disposed on opposite sidewalls of the first gate electrodes GE1. A pair of gate spacers GS may be disposed on opposite sidewalls of the outer electrode PO6. The gate spacers GS may extend in the first direction D1 along the first gate electrode GE1. The gate spacers GS may have their top surfaces higher than that of the first gate electrode GE1. The top surfaces of the gate spacers GS may be coplanar with that of the second interlayer dielectric layer 120. The gate spacers GS may be formed of and/or include at least one material selected from SiCN, SiCON, and SiN. Alternatively, the gate spacers GS may each include multiple layers formed of and/or including at least two materials selected from SiCN, SiCON, and SiN.

A gate capping pattern GP may be provided at the top surface of the first gate electrode GE1. The gate capping pattern GP may extend in the first direction D1 along the first gate electrode GE1. The gate capping pattern GP may be formed of and/or include at least one material selected from SiON, SiCN, SiCON, and SiN.

A gate dielectric layer GI may be interposed between the first gate electrode GE1 and the first to fourth semiconductor patterns SP1 to SP4. The gate dielectric layer GI may include one or more of a silicon oxide layer, a silicon oxynitride layer, and a high-k dielectric layer. In an embodiment of the present inventive concepts, the gate dielectric layer GI may include a silicon oxide layer that directly covers surfaces of the semiconductor patterns SP1 to SP4 and a high-k dielectric layer on the silicon oxide layer. For example, the gate dielectric layer GI may include a multilayer of a silicon oxide layer and a high-k dielectric layer.

The high-k dielectric layer may be formed of and/or include a high-k dielectric material whose dielectric constant is greater than that of a silicon oxide layer. For example, the high-k dielectric material may include at least one material selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The lower gate electrode LGE may include a first work-function metal pattern on the first and second semiconductor patterns SP1 and SP2. The upper gate electrode UGE may include a second work-function metal pattern on the third and fourth semiconductor patterns SP3 and SP4. For example, each of the first and second work-function metal patterns may be formed of and/or include nitrogen (N) and at least one metal selected from titanium (Ti), tantalum (Ta), aluminum (Al), tungsten (W), and molybdenum (Mo). The first and second work-function metal patterns may have their work functions different from each other. The first gate electrode GE1 may be formed of and/or include low-resistance metal (e.g., at least one selected from tungsten (W), ruthenium (Ru), aluminum (Al), titanium (Ti), and tantalum (Ta)) on the first and second work-function metal patterns. For example, the outer electrode PO6 may include the low-resistance metal.

Figure 4A:
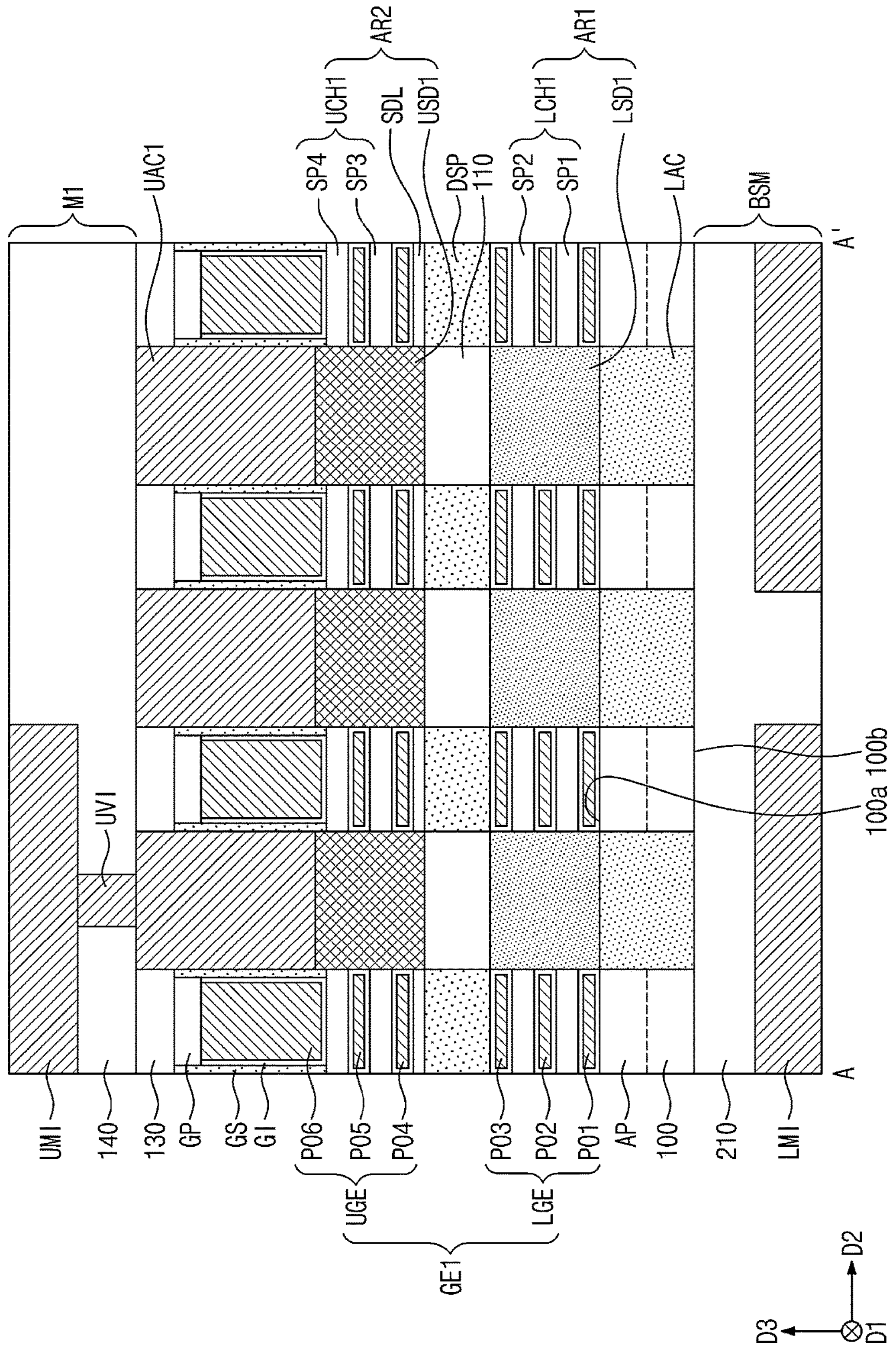
FIGS. 4A to 4E illustrate cross-sectional views of a three-dimensional semiconductor device according to some embodiments of FIG. 3.
Figure 4B:
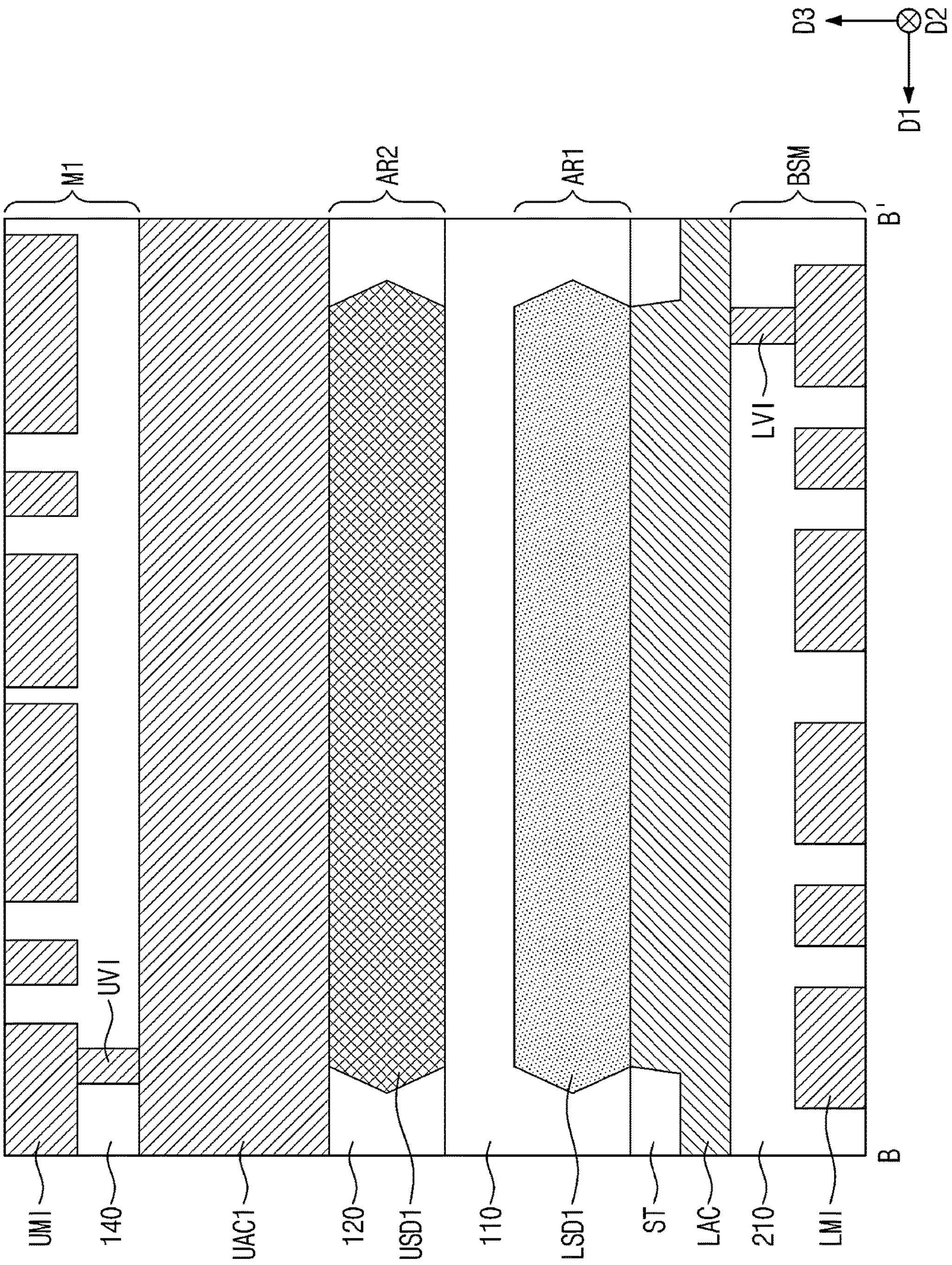
Figure 4C:
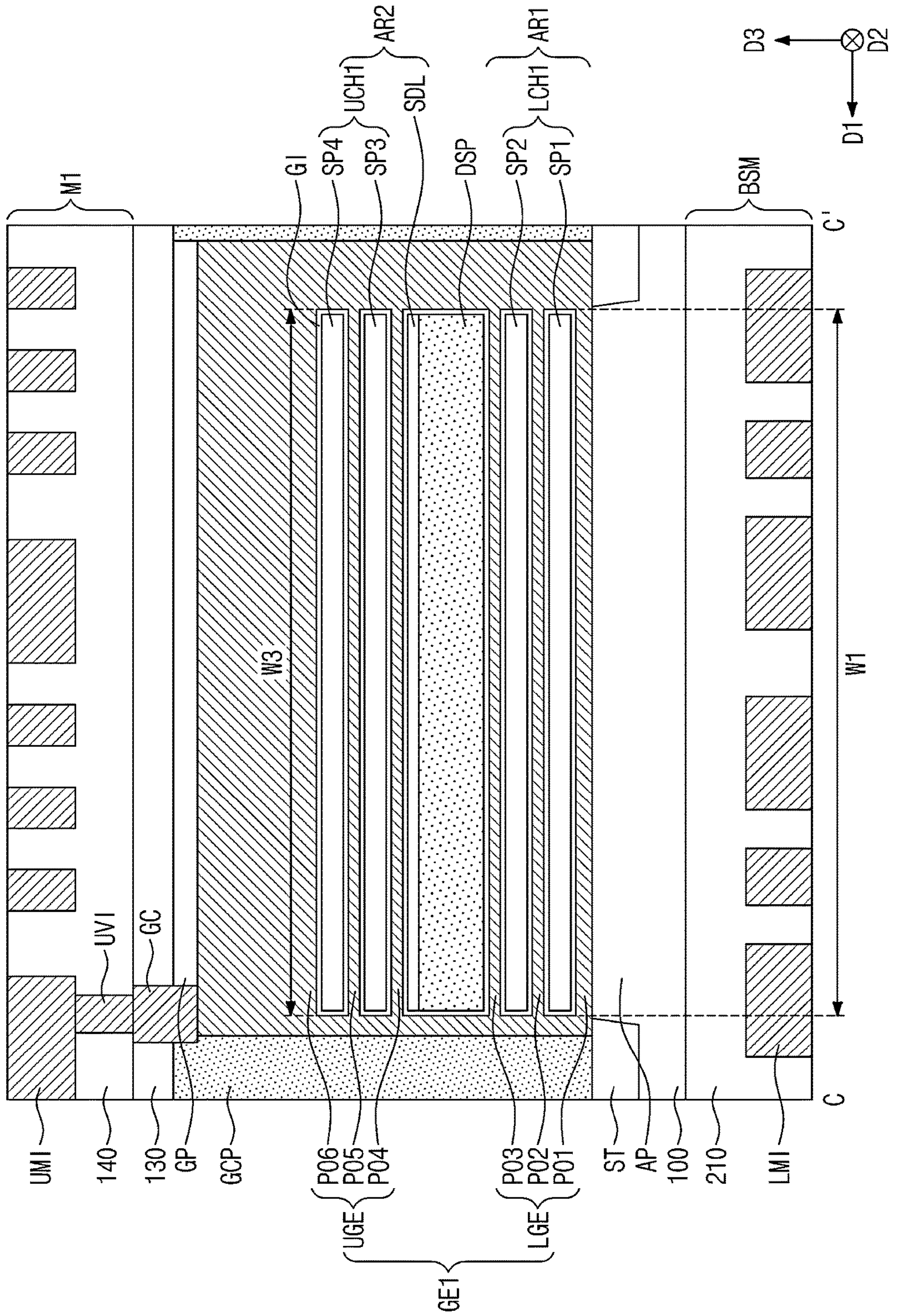

A gate cutting pattern GCP may penetrate the first gate electrode GE1. The gate cutting pattern GCP may separate the first gate electrode GE1 from another first gate electrode GE1 adjacent in the first direction D1 to the first gate electrode GE1. For example, as shown in FIG. 4C, a pair of gate cutting patterns CGP may be provided at opposite ends of the first gate electrode GE1. The gate cutting pattern GCP may be formed of and/or include a dielectric material, such as a silicon oxide layer, a silicon nitride layer, or a combination thereof.

The second interlayer dielectric layer 120 may be provided on the first upper source/drain pattern USD1 and the first gate electrodes GE1. The second interlayer dielectric layer 120 may cover the first upper source/drain pattern USD1. A third interlayer dielectric layer 130 may cover the second interlayer dielectric layer 120.

The third interlayer dielectric layer 130 may be provided on the second interlayer dielectric layer 120. A gate contact GC may be provided to penetrate through the third interlayer dielectric layer 130, the second interlayer dielectric layer 120, and the gate capping pattern GP to come into electrical connection with the first gate electrode GE1. The gate contact GC may be formed of and/or include metal selected from copper (Cu), aluminum (Al), ruthenium (Ru), cobalt (Co), tungsten (W), and molybdenum (Mo).

First upper active contacts UAC1 may be provided to penetrate through the second and third interlayer dielectric layers 120 and 130 and to correspondingly electrically connect with first upper source/drain patterns USD1. A top surface of the first upper active contact UAC1 may be coplanar with that of the third interlayer dielectric layer 130.

A fourth interlayer dielectric layer 140 may be provided on the third interlayer dielectric layer 130. A first metal layer M1 may be provided in the fourth interlayer dielectric layer 140. The first metal layer M1 may include upper lines UMI. The first metal layer M1 may include an upper via UVI. The upper via UVI may electrically connect the upper line UMI to the first upper active contact UAC1 or the gate contact GC. Each of the upper line UMI and the upper via UVI may be formed of and/or include metal selected from copper (Cu), aluminum (Al), ruthenium (Ru), cobalt (Co), tungsten (W), and molybdenum (Mo).

Additional metal layers (e.g., M2, M3, M4, etc.) may be stacked on the first metal layer M1. The first metal layer M1 and metal layers (e.g., M2, M3, M4, etc.) on the first metal layer M1 may constitute a back-end-of-line (BEOL) layer of a semiconductor device. The metal layers (e.g., M2, M3, M4, etc.) on the first metal layer M1 may include routing lines for connecting logic cells to each other.

A lower interlayer dielectric layer 210 may be provided below the second surface 100*b* of the substrate 100. A backside metal layer BSM may be provided in the lower interlayer dielectric layer 210. The backside metal layer BSM may include lower lines LMI. The backside metal layer BSM may further include a lower via LVI. The lower via LVI may electrically connect the lower line LMI to the lower active contact LAC. Each of the lower line LMI and the lower via LVI may be formed of and/or include metal selected from copper (Cu), aluminum (Al), ruthenium (Ru), cobalt (Co), tungsten (W), and molybdenum (Mo).

Additional backside metal layers may be stacked below the backside metal layer BSM. In an embodiment of the present inventive concepts, the additional backside metal layers may include a power delivery network. The power delivery network may include a wiring network for applying a source voltage (VSS) and a drain voltage (VDD) to the backside metal layer BSM.

The source voltage and the drain voltage may be applied through the power delivery network to the backside metal layer BSM. Referring back to FIG. 4B, one of the source voltage and the drain voltage may be applied to the first lower source/drain pattern LSD1 through the lower line LMI, the lower via LVI, and the lower active contact LAC. The other of the source voltage and the drain voltage may be applied through a power tab cell to the first metal layer M1. The voltage applied through the power tab cell to the first metal layer M1 may be applied to the first upper source/drain pattern USD1 through the upper line UMI, the upper via UVI, and the first upper active contact UAC1.

A three-dimensional transistor on the second region RG2 will be described below with reference to FIG. 3. As the second single height cell SHC2 has a structure similar to that of the first single height cell SHC1, a detailed description of technical features that may be duplicative to those of the transistor on the first region RG1 discussed above with reference to FIGS. 3 and 4A to 4C may be omitted.

The second single height cells SHC2 may function as a logic cell and may include a third active section AR3 and a fourth active section AR4 that are sequentially stacked on the substrate 100. One of the third and fourth active sections AR3 and AR4 may be a PMOSFET region, and the other of the third and fourth active sections AR3 and AR4 may be an NMOSFET region. The third active section AR3 may be provided on a bottom tier of a front-end-of-line (FEOL) layer, and the fourth active section AR4 may be provided on a top tier of the front-end-of-line (FEOL) layer. An NMOSFET and a PMOSFET of the third and fourth active sections AR3 and AR4 may be vertically stacked to constitute a three-dimensional stacked transistor. In an embodiment, the third active section AR3 may be an NMOSFET region, and the fourth active section AR4 may be a PMOSFET region.

An active pattern may be provided thereon with the third active section AR3 including lower channel patterns and lower source/drain patterns. The lower channel pattern may be interposed between a pair of lower source/drain patterns. The lower channel pattern may connect the pair of lower source/drain patterns to each other.

The fourth active section AR4 may include upper channel patterns and upper source/drain patterns. The upper channel patterns may correspondingly vertically overlap the lower channel patterns. The upper source/drain patterns may correspondingly vertically overlap the lower source/drain patterns. The upper channel pattern may be interposed between a pair of upper source/drain patterns. The upper channel pattern may connect the pair of upper source/drain patterns to each other. A plurality of second gate electrodes GE2 may be provided on the second single height cell SHC2 in the second region RG2. For example, the second gate electrode GE2 may be provided on the lower and upper channel patterns that are stacked. When viewed in plan, the second gate electrode GE2 may have a bar shape that extends in the first direction D1. The second gate electrode GE2 may vertically overlap the stacked lower and upper channel patterns.

The second single height cell SHC2 on the second region RG2 may be provided thereon with second upper active contacts UAC2 that are correspondingly connected to the upper source/drain patterns. When viewed in a plan view such as the view of FIG. 3, each of the second upper active contacts UAC2 may have a bar shape that extends in the first direction D1. The second upper active contacts UAC2 may vertically overlap the stacked lower and upper source/drain patterns.

Figure 4D:
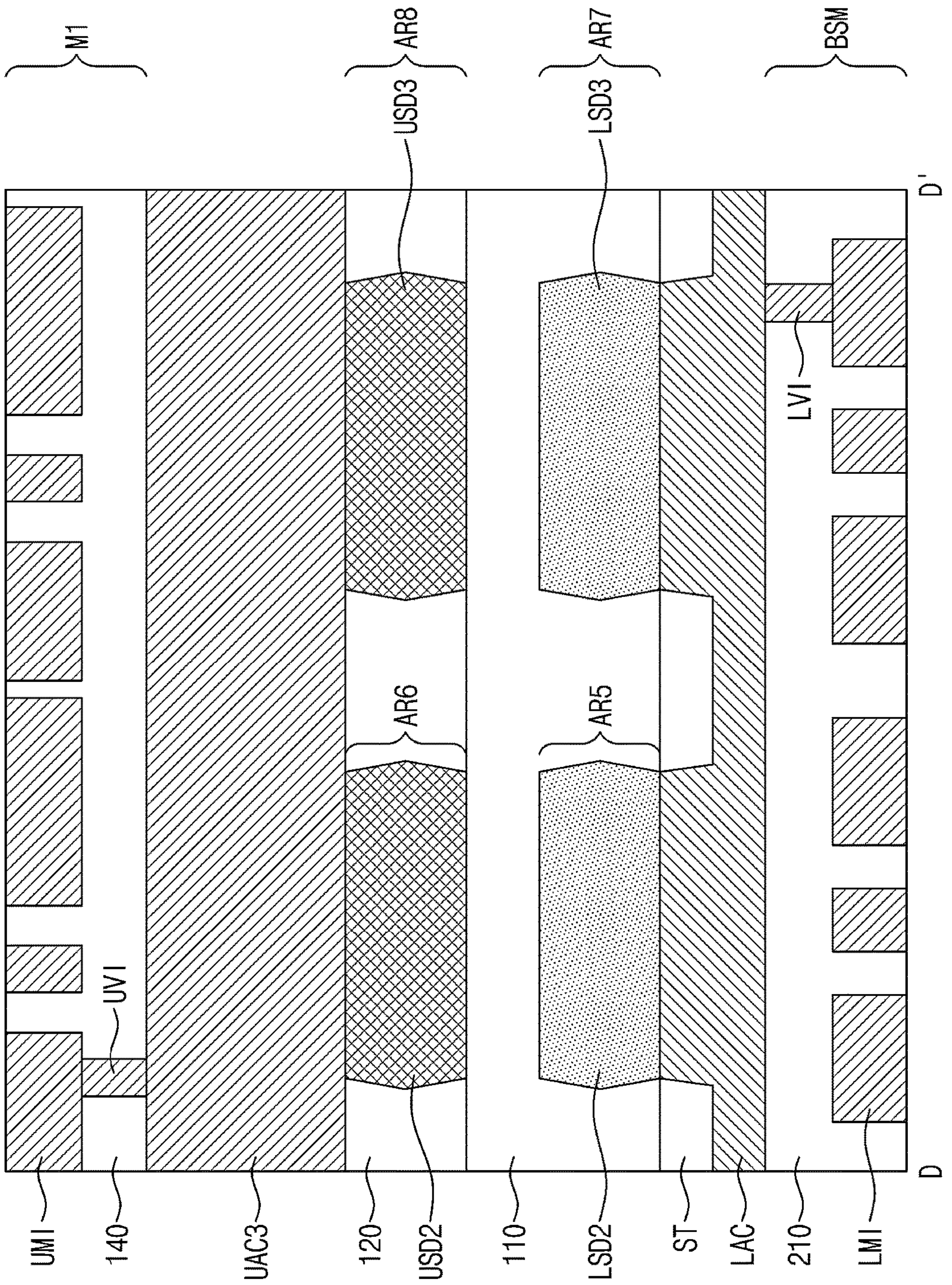

A three-dimensional transistor on the third region RG3 will be described below with reference to FIGS. 3, 4D, and 4E. A detailed description of technical features that may be duplicative of those of the transistor on the first region RG1 and those of the transistor on the second region RG2 which were discussed above with reference to FIGS. 3 and 4A to 4C may be omitted.

The first double height cell DHC1, which may function as a logic cell, of the third region RG3 may include a fifth active section AR5 and a sixth active section AR6 that are sequentially stacked on the substrate 100. The first double height cell DHC1 may include a seventh active section AR7 and an eighth active section AR8 that are sequentially stacked on the substrate 100. The seventh and eighth active sections AR7 and AR8 may be spaced apart from the fifth and sixth active sections AR5 and AR6.

One of the fifth and sixth active sections AR5 and AR6 may be a PMOSFET region, and the other of the fifth and sixth active sections AR5 and AR6 may be an NMOSFET region. The fifth active section AR5 may be provided on a bottom tier of a front-end-of-line (FEOL) layer, and the sixth active section AR6 may be provided on a top tier of the front-end-of-line (FEOL) layer. An NMOSFET and a PMOSFET of the fifth and sixth active sections AR5 and AR6 may be vertically stacked to constitute a three-dimensional stacked transistor. In an embodiment, the fifth active section AR5 may be an NMOSFET region, and the sixth active section AR6 may be a PMOSFET region.

One of the seventh and eighth active sections AR7 and AR8 may be a PMOSFET region, and the other of the seventh and eighth active sections AR7 and AR8 may be an NMOSFET region. The seventh active section AR7 may be provided on a bottom tier of a front-end-of-line (FEOL) layer, and the eighth active section AR8 may be provided on a top tier of the front-end-of-line (FEOL) layer. An NMOSFET and a PMOSFET of the seventh and eighth active sections AR7 and AR8 may be vertically stacked to constitute a three-dimensional stacked transistor. In an embodiment, the seventh active section AR7 may be an NMOSFET region, and the eighth active section AR8 may be a PMOSFET region.

In the third active section RG3, active patterns AP may be defined by a trench formed on an upper portion of the substrate 100. The active patterns AP may be vertically protruding portions of the substrate 100. The fifth and sixth active sections AR5 and AR6 may be sequentially stacked on one active pattern AP. The seventh and eighth active sections AR7 and AR8 may be sequentially stacked on another active pattern AP.

The active pattern AP may be provided thereon with the fifth active section AR5 including a second lower channel pattern LCH2 and a second lower source/drain pattern LSD2. The second lower channel pattern LCH2 may be interposed between a pair of second lower source/drain patterns LSD2. The second lower channel pattern LCH2 may connect the pair of second lower source/drain patterns LSD2 to each other.

The second lower channel pattern LCH2 may include a fifth semiconductor pattern SP5 and a sixth semiconductor pattern SP6 that are stacked while being spaced apart from each other. The fifth and sixth semiconductor patterns SP5 and SP6 may be formed of and/or include the same semiconductor material as that of the first and second semiconductor patterns SP1 and SP2. Each of the fifth and sixth semiconductor patterns SP5 and SP6 may be a nano-sheet. For example, the second lower channel pattern LCH2 may further include one or more semiconductor patterns that are stacked while being spaced apart from the sixth semiconductor pattern SP6.

The second lower source/drain patterns LSD2 may be provided at a top surface of the lower active contact LAC. The second lower source/drain patterns LSD2 may be patterns formed by the same process used for forming the first lower source/drain patterns LSD1. For example, a top surface of the second lower source/drain pattern LSD2 may be higher than that of the sixth semiconductor pattern SP6 of the second lower channel pattern LCH2. The second lower source/drain patterns LSD2 may be doped with impurities to have the first conductivity type. The first conductivity type may be of n-type or p-type. In the present embodiment, the first conductivity type may be of n-type. The second lower source/drain patterns LSD2 may be formed of and/or include one or more of silicon (Si) and silicon-germanium (SiGe).

The first interlayer dielectric layer 110 may be provided thereon with the second interlayer dielectric layer 120 and the sixth active section AR6. The sixth active section AR6 may include second upper channel patterns UCH2 and second upper source/drain patterns USD2. The second upper channel patterns UCH2 may correspondingly vertically overlap the second lower channel patterns LCH2. The second upper source/drain patterns USD2 may correspondingly vertically overlap the second lower source/drain patterns LSD2. The second upper channel pattern UCH2 may be interposed between a pair of second upper source/drain patterns USD2. The second upper channel pattern UCH2 may connect the pair of second upper source/drain patterns USD2 to each other.

The second upper channel pattern UCH2 may include a seventh semiconductor pattern SP7 and an eighth semiconductor pattern SP8 that are stacked while being spaced apart from each other. The seventh and eighth semiconductor patterns SP7 and SP8 of the second upper channel pattern UCH2 may include the same semiconductor material as that of the third and fourth semiconductor patterns SP3 and SP4 of the first upper channel pattern UCH1. Each of the seventh and eighth semiconductor patterns SP7 and SP8 may be a nano-sheet. For example, the second upper channel pattern UCH2 may further include one or more semiconductor patterns that are stacked while being spaced apart from the eighth semiconductor pattern SP8.

At least one first dummy channel pattern DSP1 may be interposed between the second lower channel pattern LCH2 and the second upper channel pattern UCH2 that overlies the second lower channel pattern LCH2. A seed layer SDL may be interposed between the first dummy channel pattern DSP1 and the second upper channel pattern UCH2. The first dummy channel pattern DSP1 may be formed of and/or include the same material as that of the dummy channel pattern DSP. The first dummy channel pattern DSP1 may be spaced apart from the second lower and upper source/drain patterns LSD2 and USD2.

The second upper source/drain patterns USD2 may be provided at the top surface of the first interlayer dielectric layer 110. Each of the second upper source/drain patterns USD2 may be an epitaxial pattern formed by a selective epitaxial growth (SEG) process. For example, a top surface of the second upper source/drain pattern USD2 may be higher than that of the eighth semiconductor pattern SP8 of the second upper channel pattern UCH2.

The second upper source/drain patterns USD2 may be doped with impurities to have the second conductivity type. The second conductivity type may be different from the first conductivity type of the second lower source/drain pattern LSD2. The second conductivity type may be of p-type. The second upper source/drain patterns USD2 may be formed of and/or include one or more of silicon-germanium (SiGe) and silicon (Si).

Another active pattern AP may be provided thereon with the seventh active section AR7 including a third lower channel pattern LCH3 and a third lower source/drain pattern LSD3. The third lower channel pattern LCH3 may be interposed between a pair of third lower source/drain patterns LSD3. The third lower channel pattern LCH3 may connect the pair of third lower source/drain patterns LSD3 to each other.

The third lower channel pattern LCH3 may include a ninth semiconductor pattern SP9 and a tenth semiconductor pattern SP10 that are stacked while being spaced apart from each other. The ninth and tenth semiconductor patterns SP9 and SP10 may be formed of and/or include the same semiconductor material as that of the fifth and sixth semiconductor patterns SP5 and SP6. Each of the ninth and tenth semiconductor patterns SP9 and SP10 may be a nano-sheet. For example, the third lower channel pattern LCH3 may further include one or more semiconductor patterns that are stacked while being spaced apart from the tenth semiconductor pattern SP10.

The third lower source/drain patterns LSD3 may be provided at the top surface of the lower active contact LAC. The third lower source/drain patterns LSD3 may be patterns formed by the same process used for forming the first lower source/drain patterns LSD1. For example, a top surface of the third lower source/drain pattern LSD3 may be higher than that of the tenth semiconductor pattern SP10 of the third lower channel pattern LCH3. The third lower source/drain patterns LSD3 may be doped with impurities to have the first conductivity type. The first conductivity type may be of n-type or p-type. In the present embodiment, the first conductivity type may be of n-type. The third lower source/drain patterns LSD3 may be formed of and/or include one or more of silicon (Si) and silicon-germanium (SiGe).

The first interlayer dielectric layer 110 may be provided thereon with the second interlayer dielectric layer 120 and the eighth active section AR8. The eighth active section AR8 may include third upper channel patterns UCH3 and third upper source/drain patterns USD3. The third upper channel patterns UCH3 may correspondingly vertically overlap the third lower channel patterns LCH3. The third upper channel patterns UCH3 may correspondingly vertically overlap the third lower source/drain patterns LSD3. The third upper channel pattern UCH3 may be interposed between a pair of third upper source/drain patterns USD3. The third upper channel pattern UCH3 may connect the pair of third upper source/drain patterns USD3 to each other.

The third upper channel pattern UCH3 may include an eleventh semiconductor pattern SP11 and a twelfth semiconductor pattern SP12 that are stacked while being spaced apart from each other. The eleventh and twelfth semiconductor patterns SP11 and SP12 of the third upper channel pattern UCH3 may be formed of and/or include the same semiconductor material as that of the seventh and eighth semiconductor patterns SP7 and SP8 of the third upper channel pattern UCH3. Each of the eleventh and twelfth semiconductor patterns SP11 and SP12 may be a nano-sheet. For example, the third upper channel pattern UCH3 may further include one or more semiconductor patterns that are stacked while being spaced apart from the twelfth semiconductor pattern SP12.

At least one second dummy channel pattern DSP2 may be interposed between the third lower channel pattern LCH3 and the third upper channel pattern UCH3 that overlies the third lower channel pattern LCH3. A seed layer SDL may be interposed between the second dummy channel pattern DSP2 and the third upper channel pattern UCH3. The second dummy channel pattern DSP2 may be formed of and/or include the same material as that of the dummy channel pattern DSP. The second dummy channel pattern DSP2 may be spaced apart from the third lower and upper source/drain patterns LSD3 and USD3.

The third upper source/drain patterns USD3 may be provided at the top surface of the first interlayer dielectric layer 110. Each of the third upper source/drain patterns USD3 may be an epitaxial pattern formed by a selective epitaxial growth (SEG) process. For example, a top surface of the third upper source/drain pattern USD3 may be higher than that of the twelfth semiconductor pattern SP12 of the third upper channel pattern UCH3.

The third upper source/drain patterns USD3 may be doped with impurities to have the second conductivity type. The second conductivity type may be different from the first conductivity type of the third lower source/drain pattern LSD3. The second conductivity type may be of p-type. The third upper source/drain patterns USD3 may be formed of and/or include one or more of silicon-germanium (SiGe) and silicon (Si).

A plurality of third gate electrodes GE3 may be provided on the first double height cell DHC1 on the third region RG3. For example, the third gate electrode GE3 may be provided on the second lower and upper channel patterns LCH2 and UCH3 that are stacked and on the third lower and upper channel patterns LCH3 and UCH3 that are stacked. When viewed in a plan view such as the view of FIG. 3, the third gate electrode GE3 may have a bar shape that extends in the first direction D1. The third gate electrode GE3 may vertically overlap the stacked second lower and upper channel patterns LCH2 and UCH2 and the stacked third lower and upper channel patterns LCH3 and UCH3.

The first double height cell DHC1 on the third region RG3 may be provided thereon with third upper active contacts UAC3 that are correspondingly electrically connected to the second and third upper source/drain patterns USD2 and USD3. When viewed in a plan view such as the view of FIG. 3, each of the third active contacts UAC3 may have a bar shape that extends in the first direction D1. The third upper active contacts UAC3 may vertically overlap the stacked second lower and upper source/drain patterns LSD2 and USD2 and the stacked third lower and upper source/drain patterns LSD3 and USD3.

The third upper active contact UAC3 may be in contact with the second and third upper source/drain patterns USD2 and USD3. For example, the third upper active contact UAC3 may be electrically connected to the second and third upper source/drain patterns USD2 and USD3. A width in the first direction D1 of the third upper active contact UAC3 may be greater than a maximum width in the first direction D1 of each of the second and third upper source/drain patterns USD2 and USD3.

Referring back to FIG. 3, a width in the first direction D1 of the second upper active contact UAC2 may be less than a width in the first direction D1 of the first upper active contact UAC1 and the width in the first direction D1 of the third upper active contact UAC3. For example, the width in the first direction D1 of the first upper active contact UAC1 may be the same as the width in the first direction D1 of the third upper active contact UAC3.

Figure 4E:
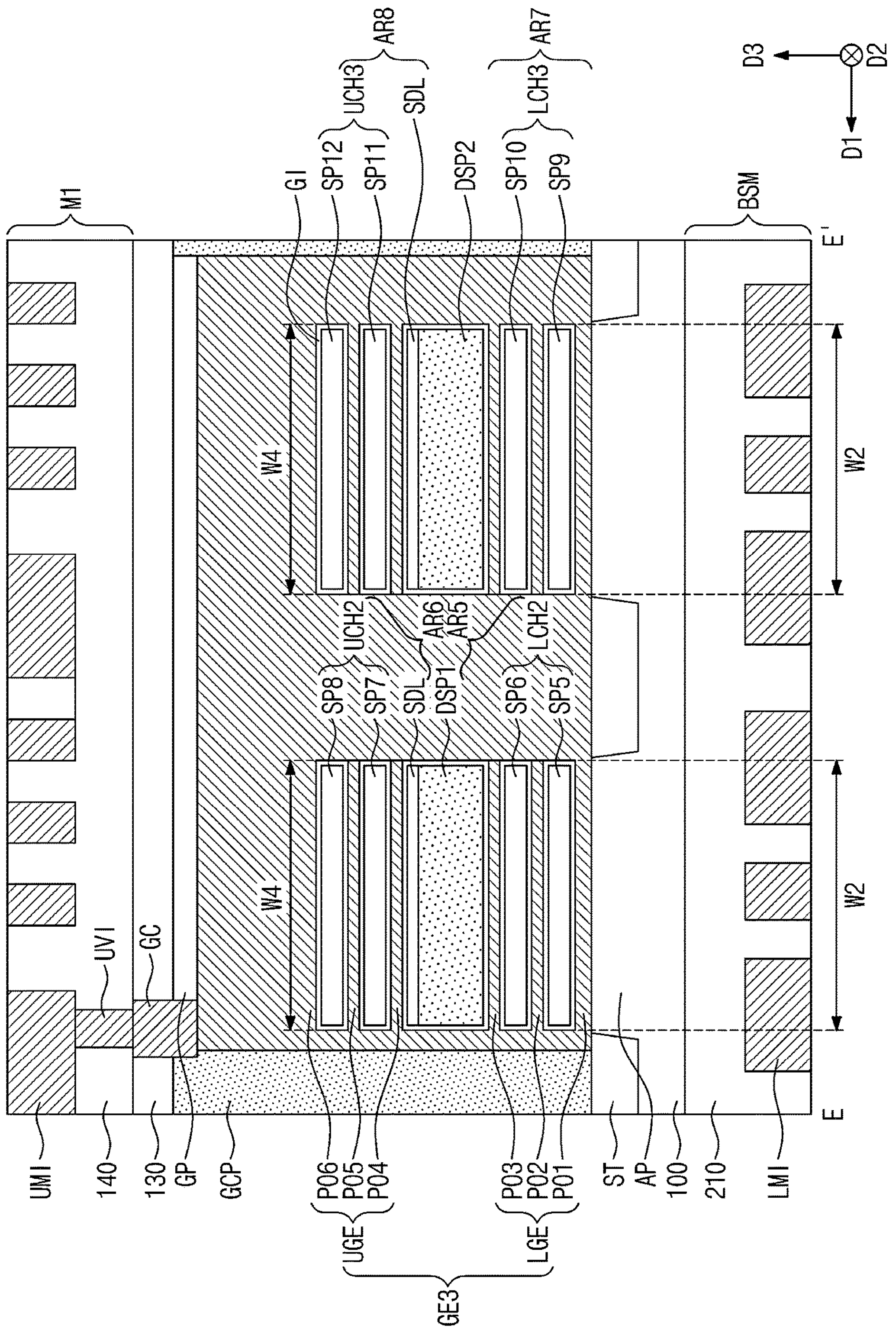

Referring to FIGS. 4C and 4E, the first lower channel patterns LCH1 may each have a first width W1 in the first direction D1. The first width W1 may be defined to refer to a horizontal distance from one lateral surface (e.g., a first lateral surface) of the first lower channel pattern LCH1 to another lateral surface (e.g., a second lateral surface), which may be opposite to the one lateral surface, of the first lower channel pattern LCH1. The first width W1 may be the same as a width in the first direction D1 of each of the first and second semiconductor patterns SP1 and SP2.

Each of the second and third lower channel patterns LCH2 and LCH3 may have a second width W2 in the first direction D1. The second width W2 may be defined as a horizontal distance from one lateral surface (e.g., a first lateral surface) of the second or third lower channel pattern LCH2 or LCH3 to another lateral surface (e.g., a second lateral surface) of the second or third lower channel pattern LCH2 or LCH3, which may be opposite to the one lateral surface of the second or third lower channel pattern LCH2 or LCH3. The second width W2 may be the same as a width in the first direction D1 of each of the fifth, sixth, ninth, and tenth semiconductor patterns SP5, SP6, SP9, and SP10.

The first upper channel patterns UCH1 may each have a third width W3 in the first direction D1. The third width W3 may be defined to refer to a horizontal distance from one lateral surface (e.g., a first lateral surface) of the first upper channel pattern UCH1 to another lateral surface (e.g., a second lateral surface), which may be opposite to the one lateral surface, of the first upper channel pattern UCH1. The third width W3 may be the same as a width in the first direction D1 of each of the third and fourth semiconductor patterns SP3 and SP4.

Each of the second and third upper channel patterns UCH2 and UCH3 may have a fourth width W4 in the first direction D1. The fourth width W4 may be defined as a horizontal distance from one lateral surface (e.g., a first lateral surface) of the second or third upper channel pattern UCH2 or UCH3 to another lateral surface (e.g., a second lateral surface), which may be opposite to the one lateral surface, of the second or third upper channel pattern UCH2 or UCH3. The fourth width W4 may be the same as a width in the first direction D1 of each of the seventh, eighth, eleventh, and twelfth semiconductor patterns SP7, SP8, SP11, and SP12.

The first width W1 may be greater than the second width W2. For example, the first width W1 may be 1.5 times to 2.5 times the second width W2. The first width W1 may be greater than a width in the first direction D1 of the lower channel pattern of the second single height cell SHC2 on the second region RG2. The first width W1 may be the same as the third width W3. The third width W3 may be greater than a width in the first direction D1 of the upper channel pattern of the second single height cell SHC2 on the second region RG2.

The second width W2 may be the same as the fourth width W4. The third width W3 may be greater than the fourth width W4. For example, the third width W3 may be 1.5 times to 2.5 times the fourth width W4. The second width W2 may be same as or greater than the width in the first direction D1 of the lower channel pattern of the second single height cell SHC2 on the second region RG2. The fourth width W4 may be same as or greater than the width in the first direction D1 of the lower channel pattern of the second single height cell SHC2 on the second region RG2.

The first to fourth widths W1 to W4 may be the effective channel width of a transistor in each the first to third regions RG1 to RG3, respectively. Based on whether the transistor is a part of a logic cell or logic device that performs specific functions, the effective channel widths may be changed to optimize the operating speed and performance of a three-dimensional semiconductor device. For example, in a three-dimensional semiconductor device according to the present inventive concepts, effective widths of nano-sheets on a logic cell may be changed to improve electrical properties.

Figure 5:
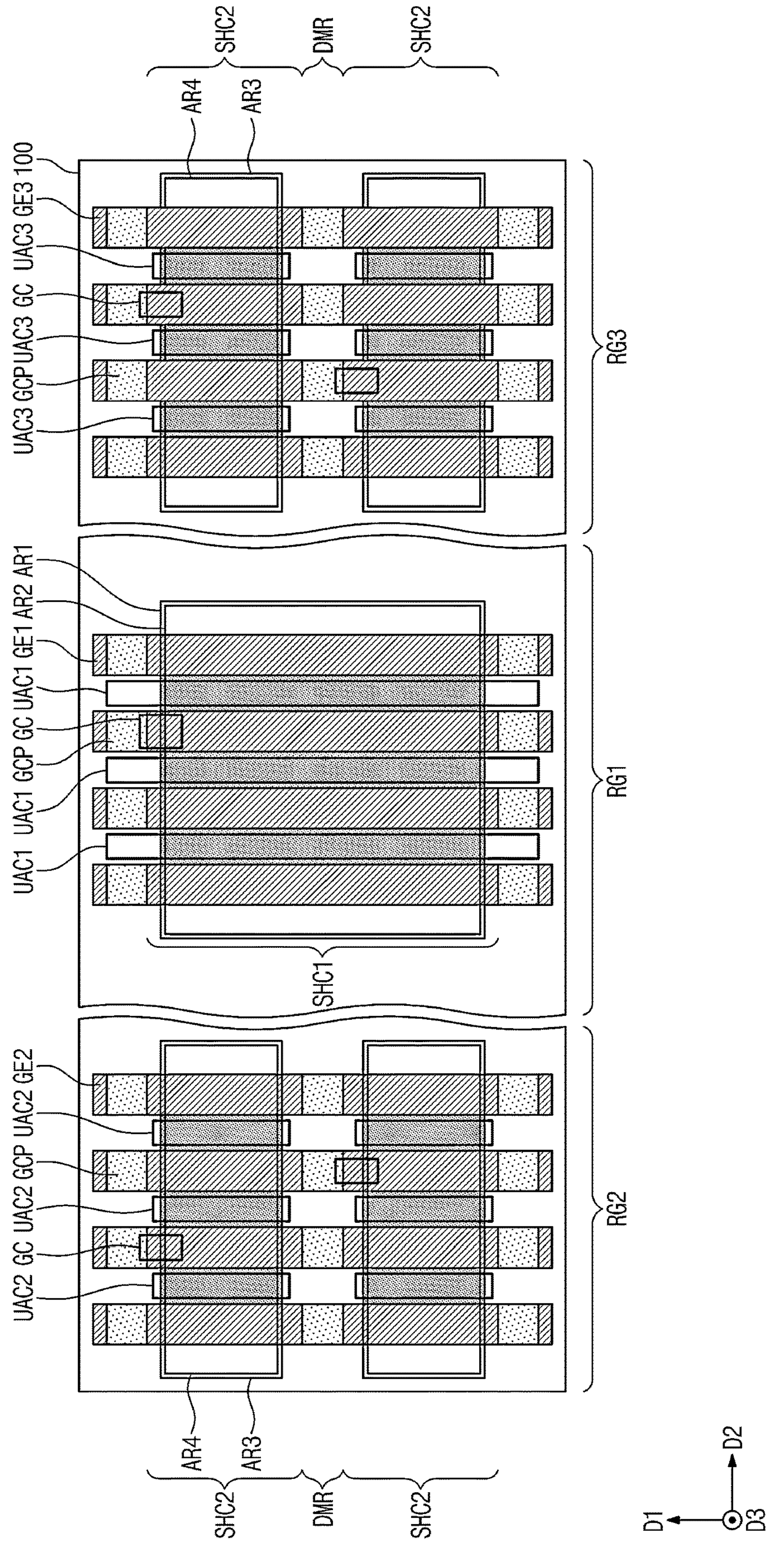
FIGS. 5 and 6 illustrate plan views of a logic cell of a three-dimensional semiconductor device according to some embodiments of the present inventive concepts.
Figure 6:
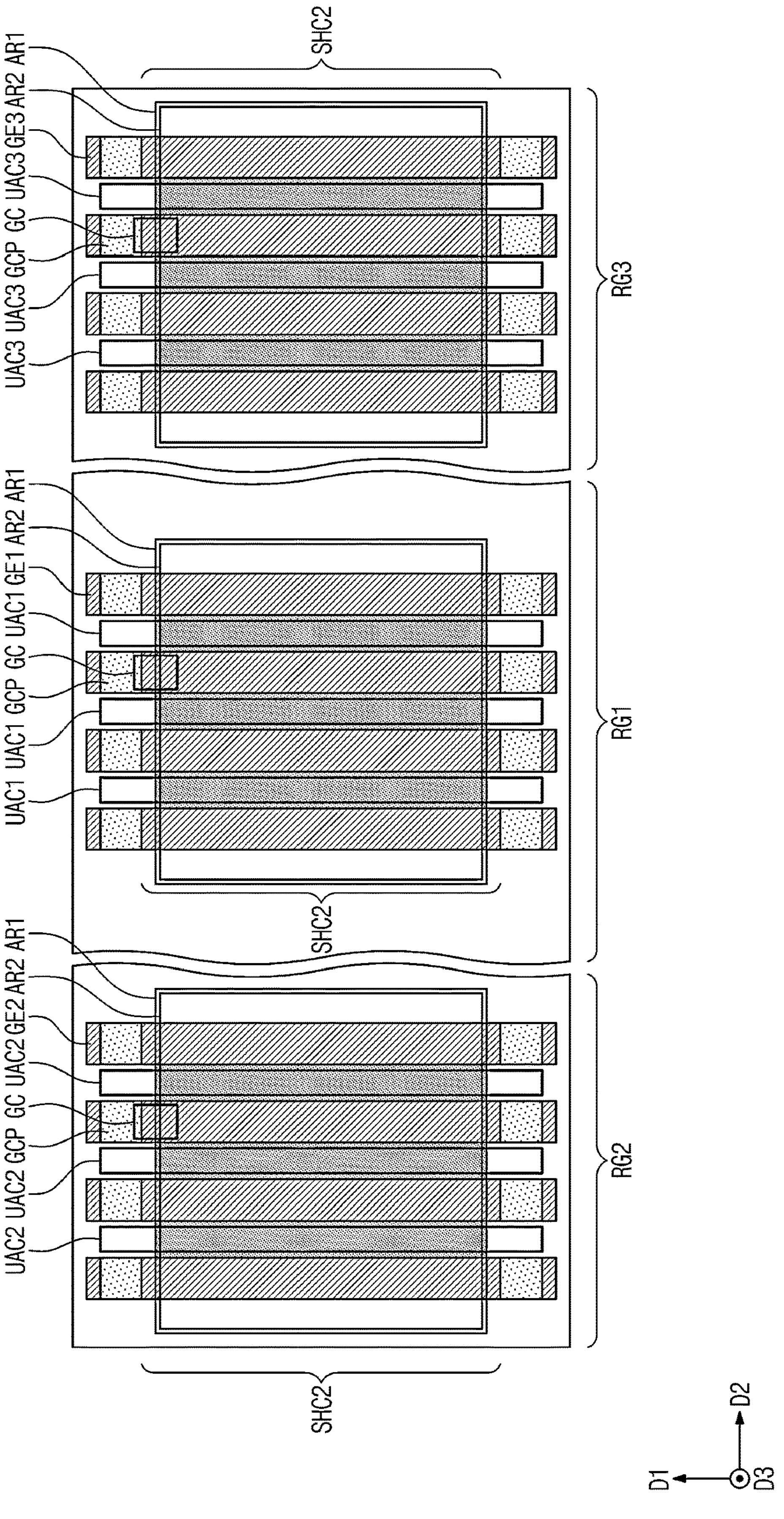

FIGS. 5 and 6 illustrate cross-sectional views showing a three-dimensional semiconductor device according to some embodiments of the present inventive concepts. A detailed description of technical features of transistors of the first single height cell SHC1, the second single height cell SHC2, and the first double height cell DHC1 which were previously discussed with reference to FIGS. 3 and 4A to 4E may be omitted and differences thereof will be explained in detail.

Referring to FIG. 5, a substrate 100 may be provided which includes a first region RG1, a second region RG2, and a third region RG3. The first region RG1 may be provided thereon with the first single height cell SHC1 discussed with reference to FIG. 3. The second region RG2 and the third region RG3 may be provided thereon with the second single height cells SHC2 and the dummy region DMR discussed with reference to FIGS. 1B and 3. For example, the first to third regions RG1 to RG3 may be provided thereon with a combination of the first and second single height cells SHC1 and SHC2. In another example, the first single height cell SHC1 may be disposed in a region other than the first region RG1, such as on the second region RG2 or the third region RG3.

Referring to FIG. 6, a substrate 100 may be provided which includes a first region RG1, a second region RG2, and a third region RG3. The first single height cell SHC1 discussed with reference to FIG. 3 may be provided in each of the first to third regions RG1 to RG3. For example, a transistor of the first single height cell SHC1 depicted in FIG. 6 may be an extra gate (EG) device or may include a long gate transistor (or long channel transistor) whose gate length (or channel length) is relatively large.

In a three-dimensional semiconductor device according to the present inventive concepts, the first region RG1, the second region RG2, and the third region RG3 may be provided thereon with various combinations of logic devices that perform specific functions. Thus, a dummy region between logic cells may have a small area to increase integration of the three-dimensional semiconductor device compared to a two-dimensional semiconductor device.

In addition, compared to a single height cell of a two-dimensional or three-dimensional semiconductor device, a single device using the first double height cell DHC1 of FIG. 3 may additionally obtain a process margin of metal layers. Therefore, wiring lines may be additionally disposed in the metal layers or a width of a metal line may be increased to reduce resistance of back-end-of-line (BEOL) layer of the three-dimensional semiconductor device. Accordingly, the three-dimensional semiconductor device may have improved electrical properties.

Figure 9A:
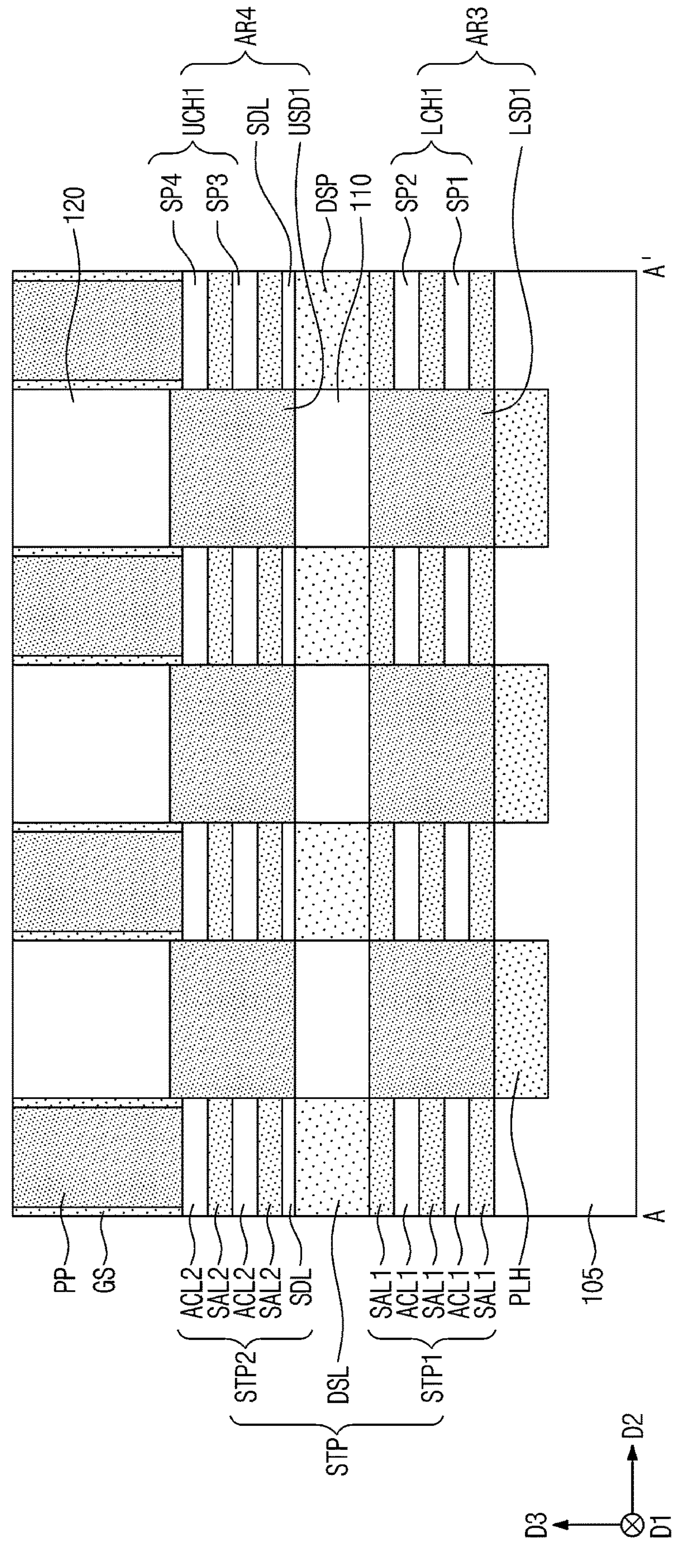
FIGS. 9A to 9C illustrate diagrams showing a method of fabricating a three-dimensional semiconductor device according to some embodiments of the present inventive concepts.
Figure 9B:
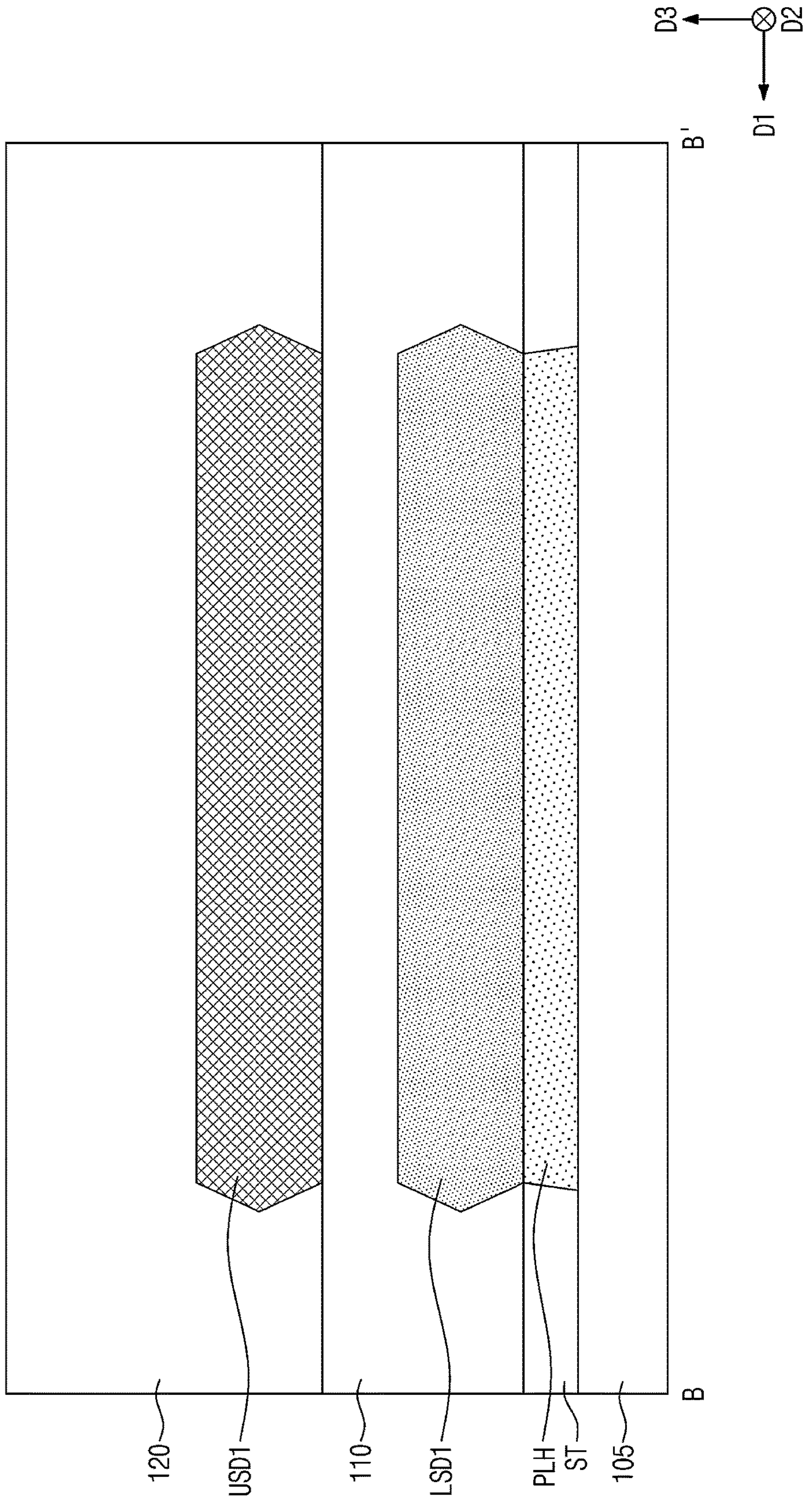
Figure 9C:
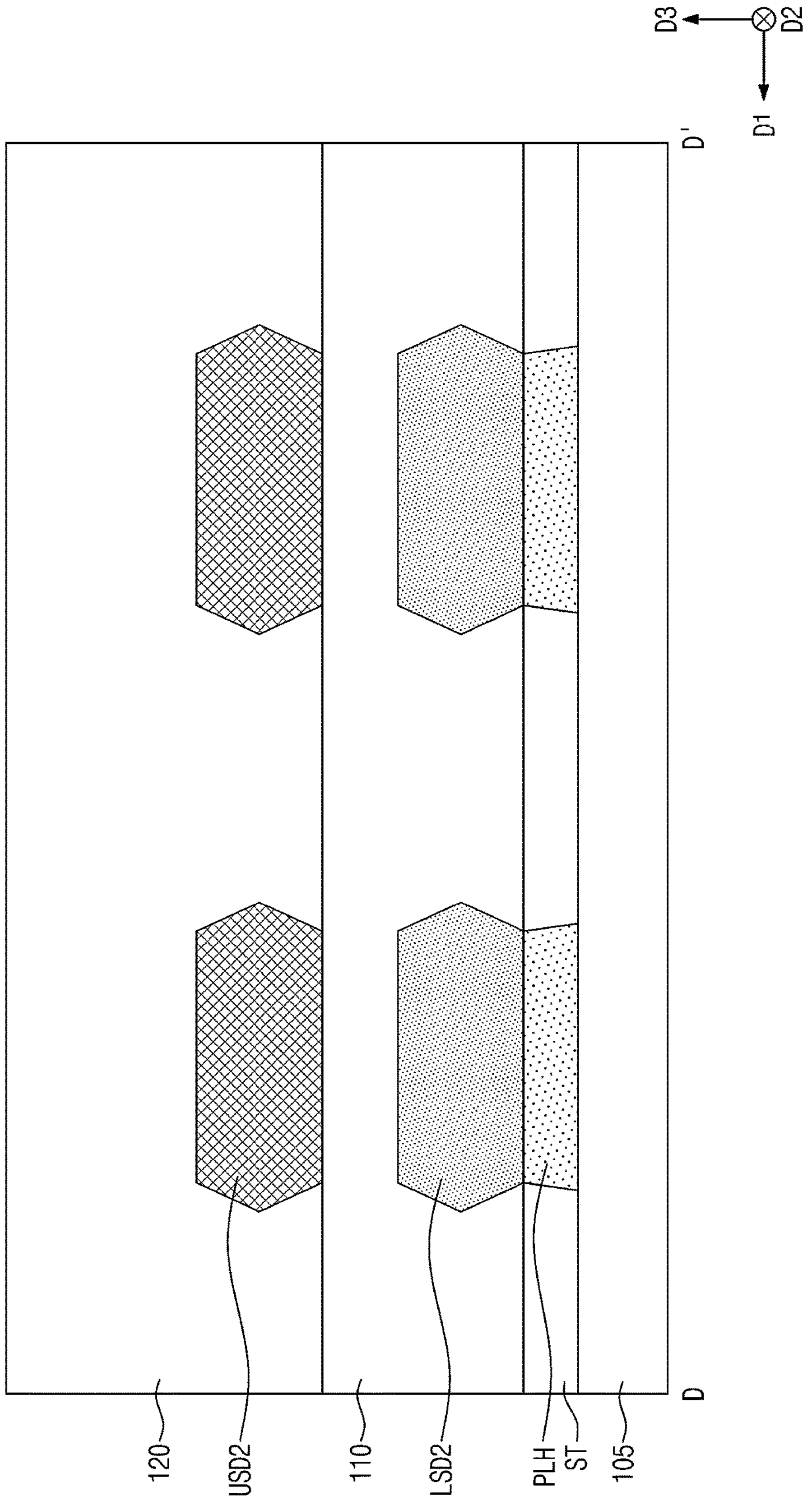
Figure 10A:
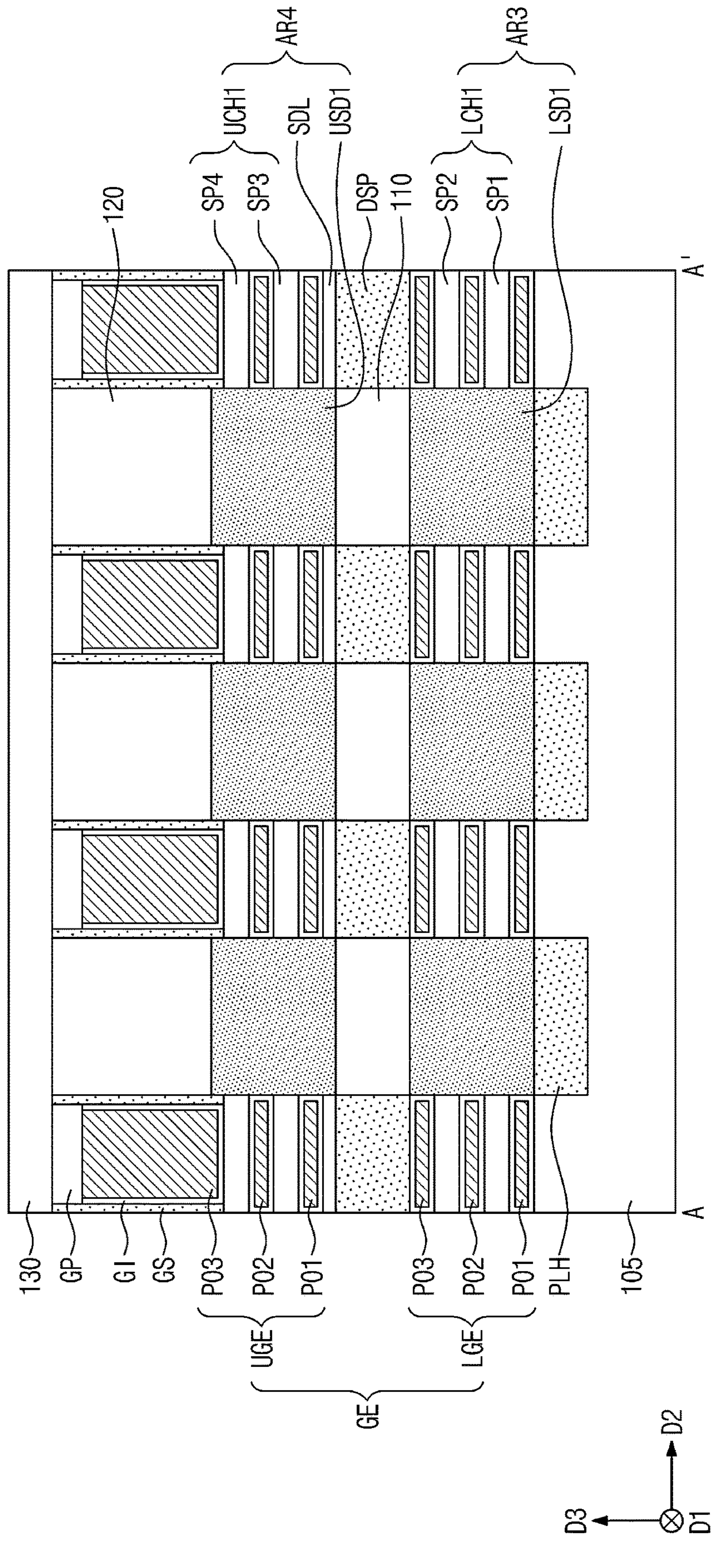
FIGS. 10A to 10E illustrate diagrams showing a method of fabricating a three-dimensional semiconductor device according to some embodiments of the present inventive concepts.
Figure 10B:
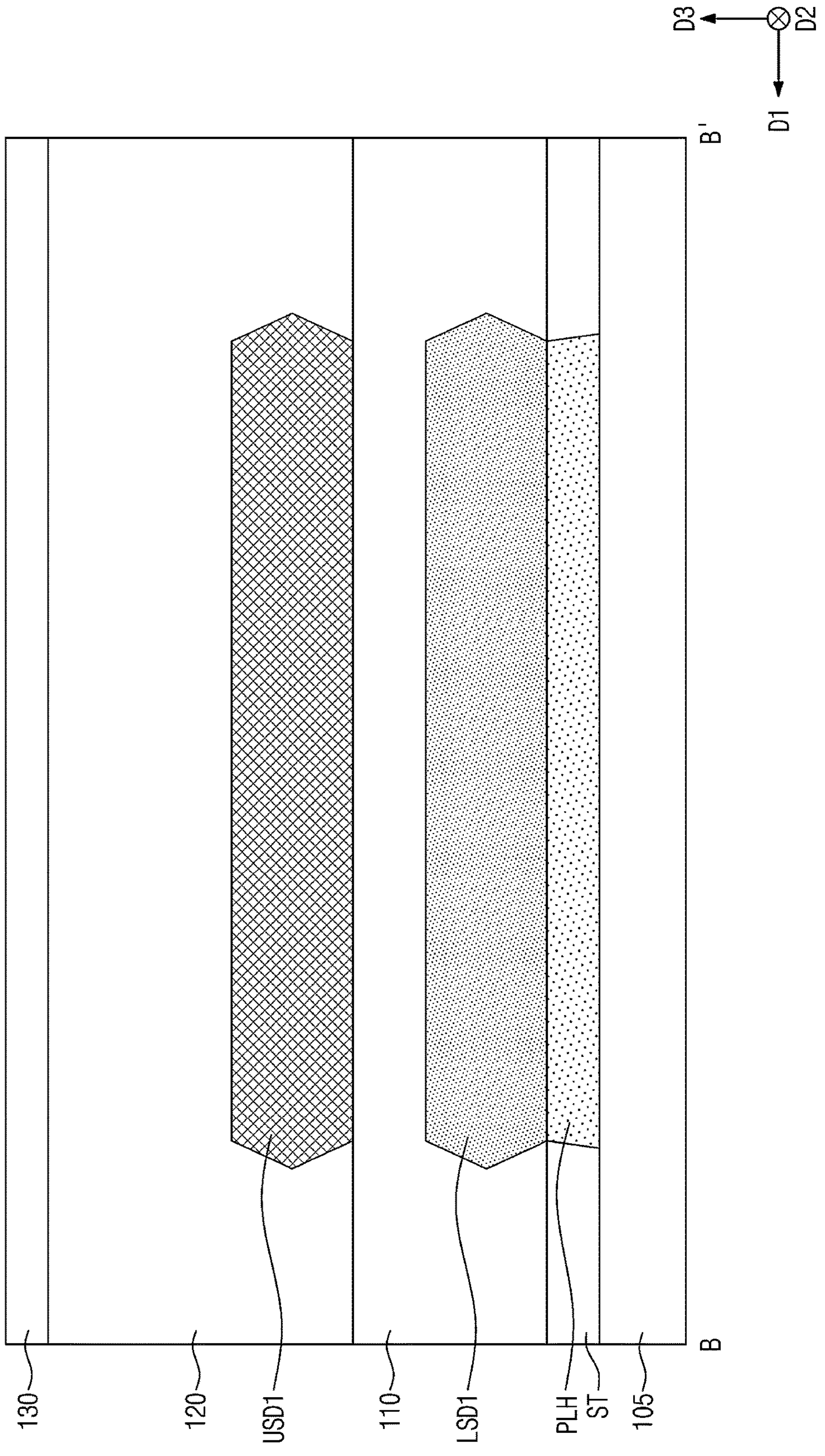
Figure 10C:
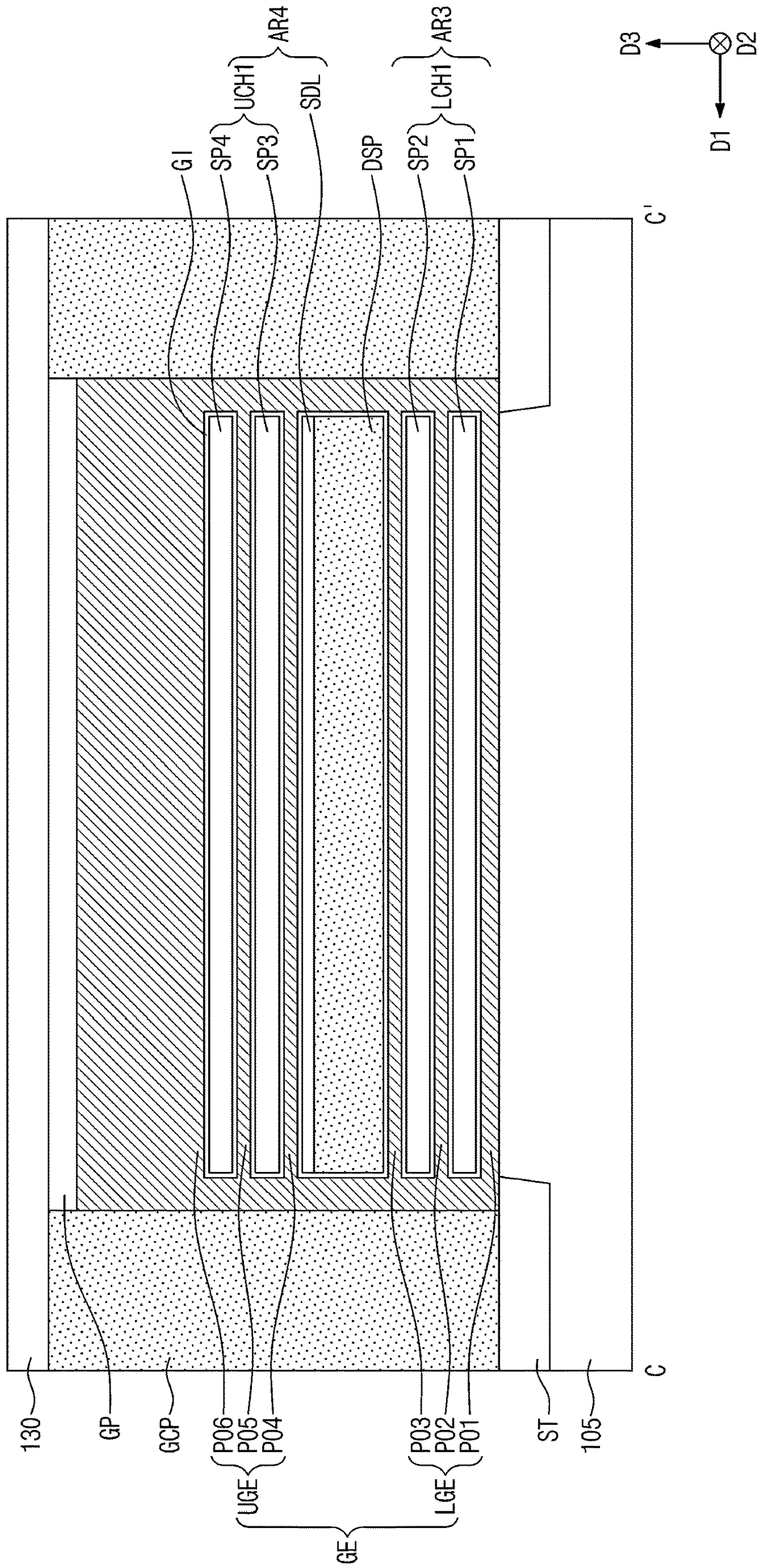
Figure 10D:
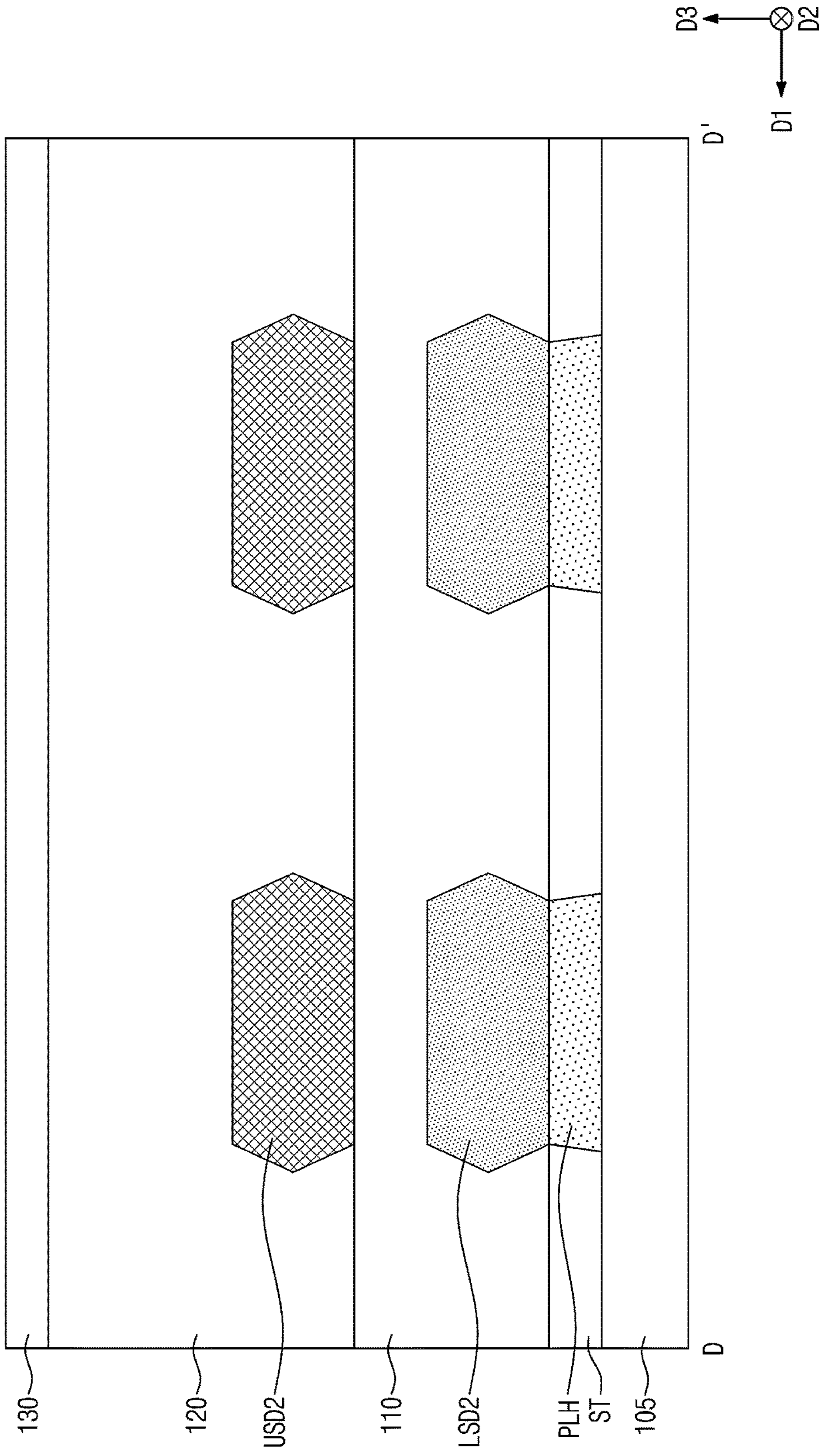
Figure 10E:
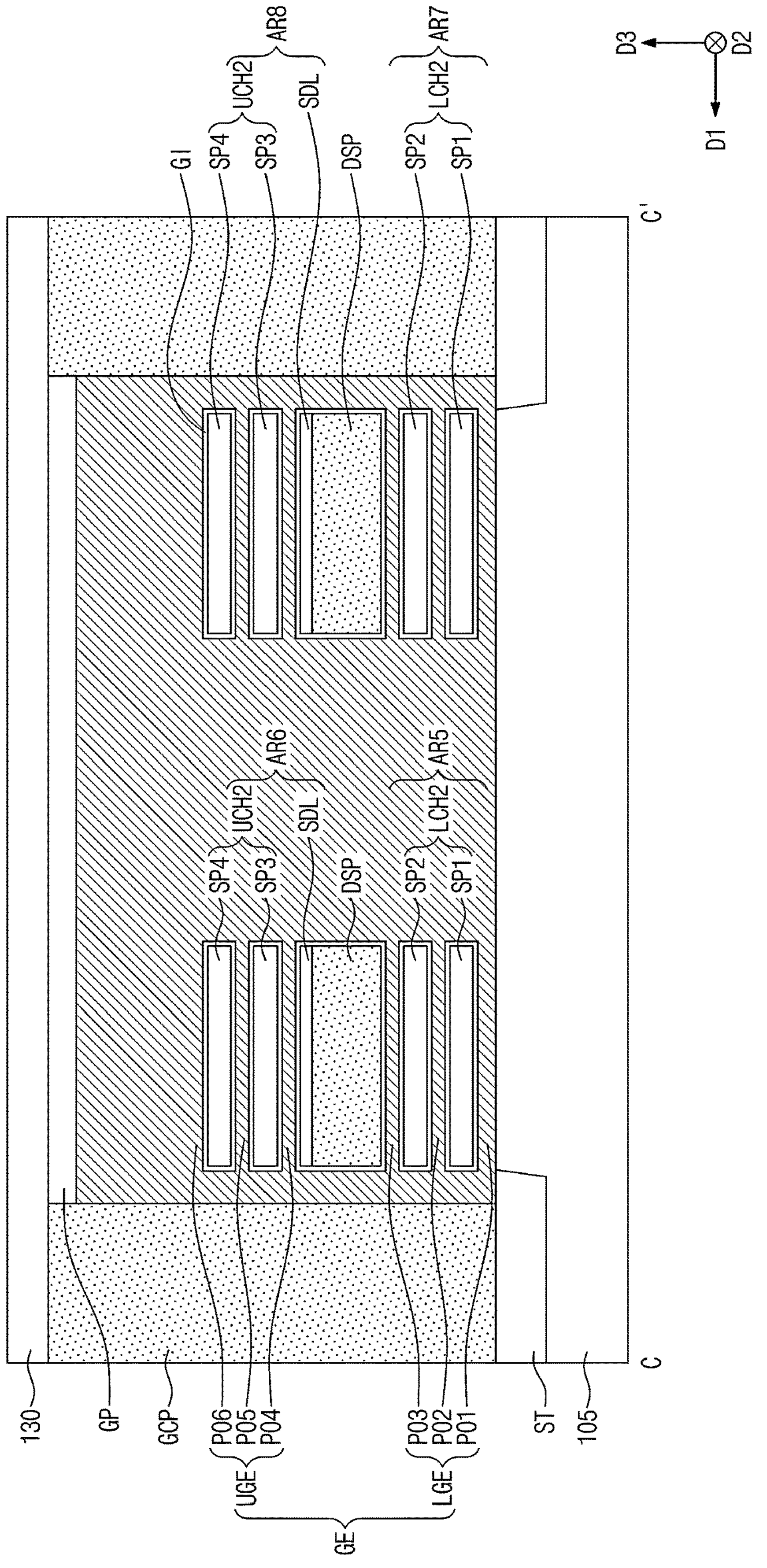

FIGS. 7A to 10E illustrate diagrams showing a method of fabricating a three-dimensional semiconductor device according to some embodiments of the present inventive concepts. For example, FIGS. 7A, 8A, 9A, and 10A illustrate cross-sectional views taken along line A-A' of FIG. 3. FIGS. 7B, 8B, 9B, and 10B illustrate cross-sectional views taken along line B-B' of FIG. 3. FIGS. 8C and 10C illustrate cross-sectional views taken along line C-C' of FIG. 3. FIGS. 7C, 8D, 9C, and 10D illustrate cross-sectional views taken along line D-D' of FIG. 3. FIG. 8E and 10E illustrate cross-sectional views taken along line E-E' of FIG. 3.

With reference to FIGS. 7A to 10E, a method of fabricating a three-dimensional semiconductor device according to FIGS. 3 to 4E will be described. For brevity of description, technical features described previously may be described briefly or not at all with the understanding that the previous description is applicable.

Figure 7A:
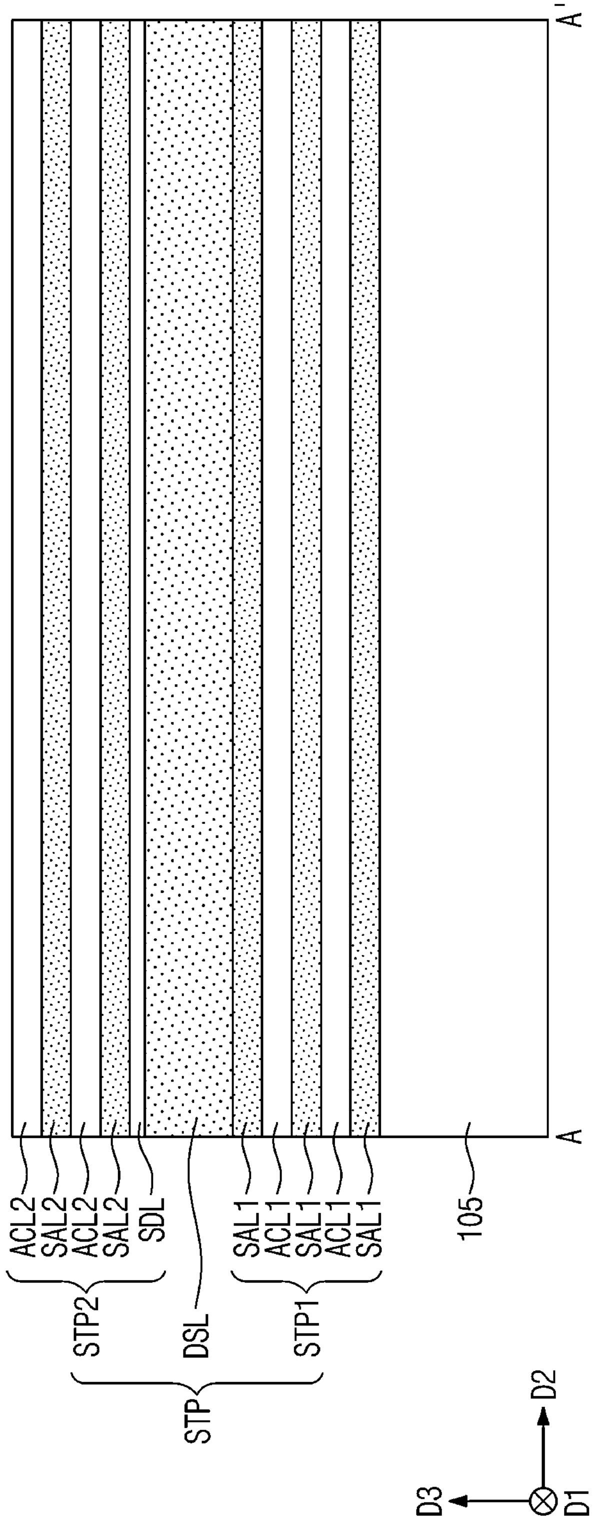
FIGS. 7A to 7C illustrate diagrams showing a method of fabricating a three-dimensional semiconductor device according to some embodiments of the present inventive concepts.
Figure 7B:
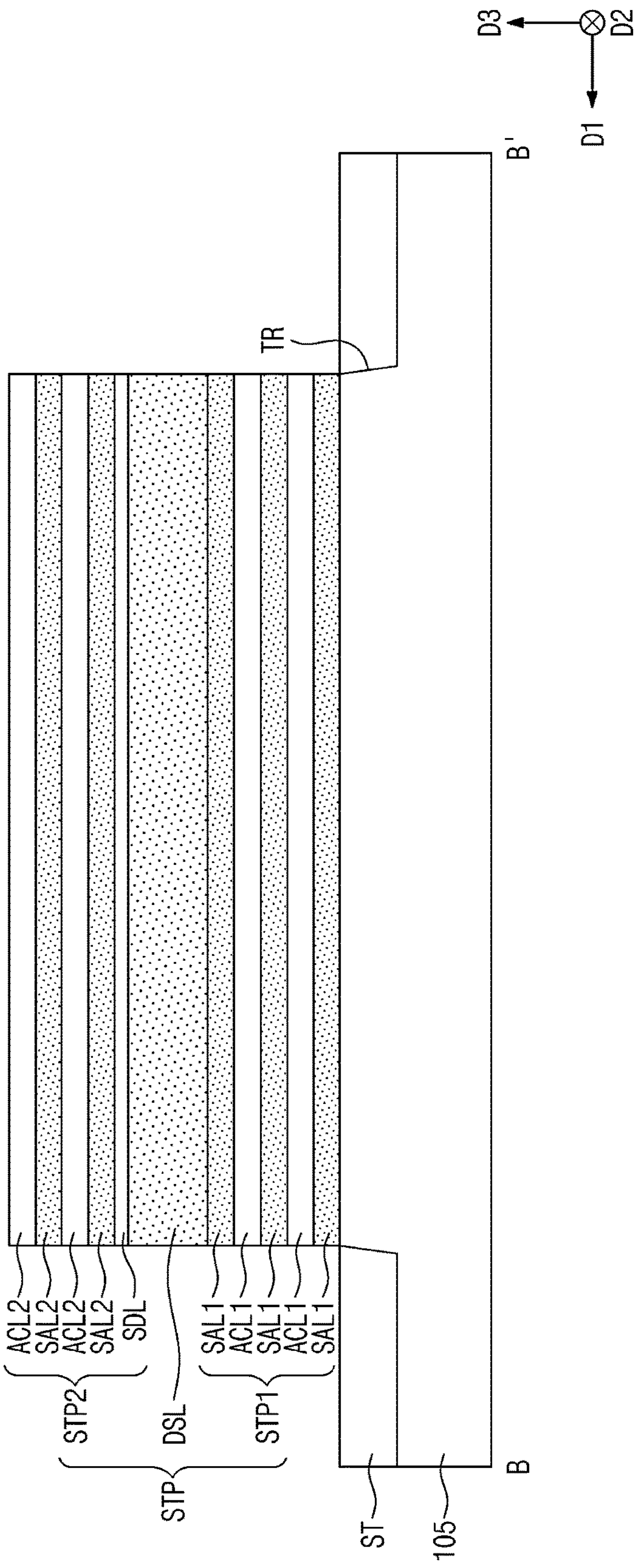
Figure 7C:
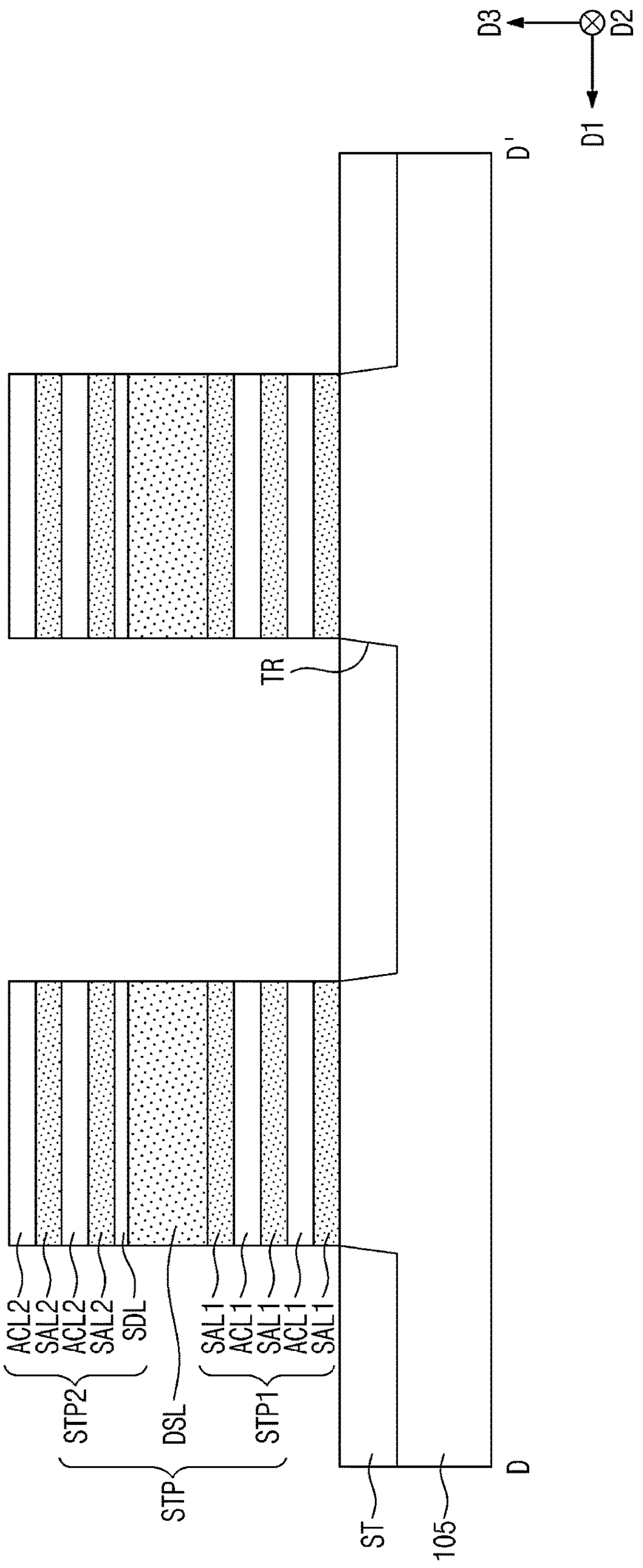
Figure 8A:
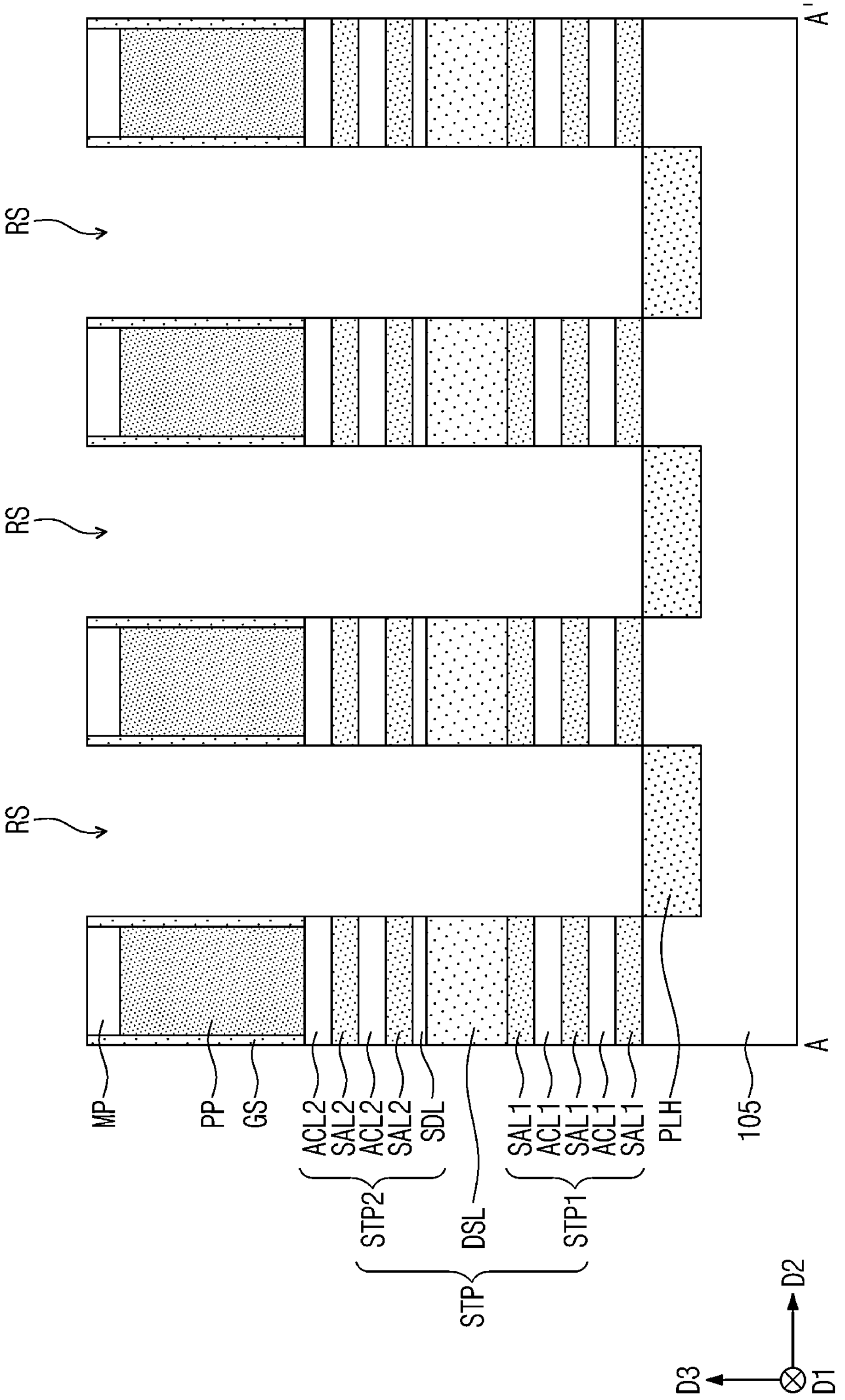
FIGS. 8A to 8E illustrate diagrams showing a method of fabricating a three-dimensional semiconductor device according to some embodiments of the present inventive concepts.
Figure 8B:
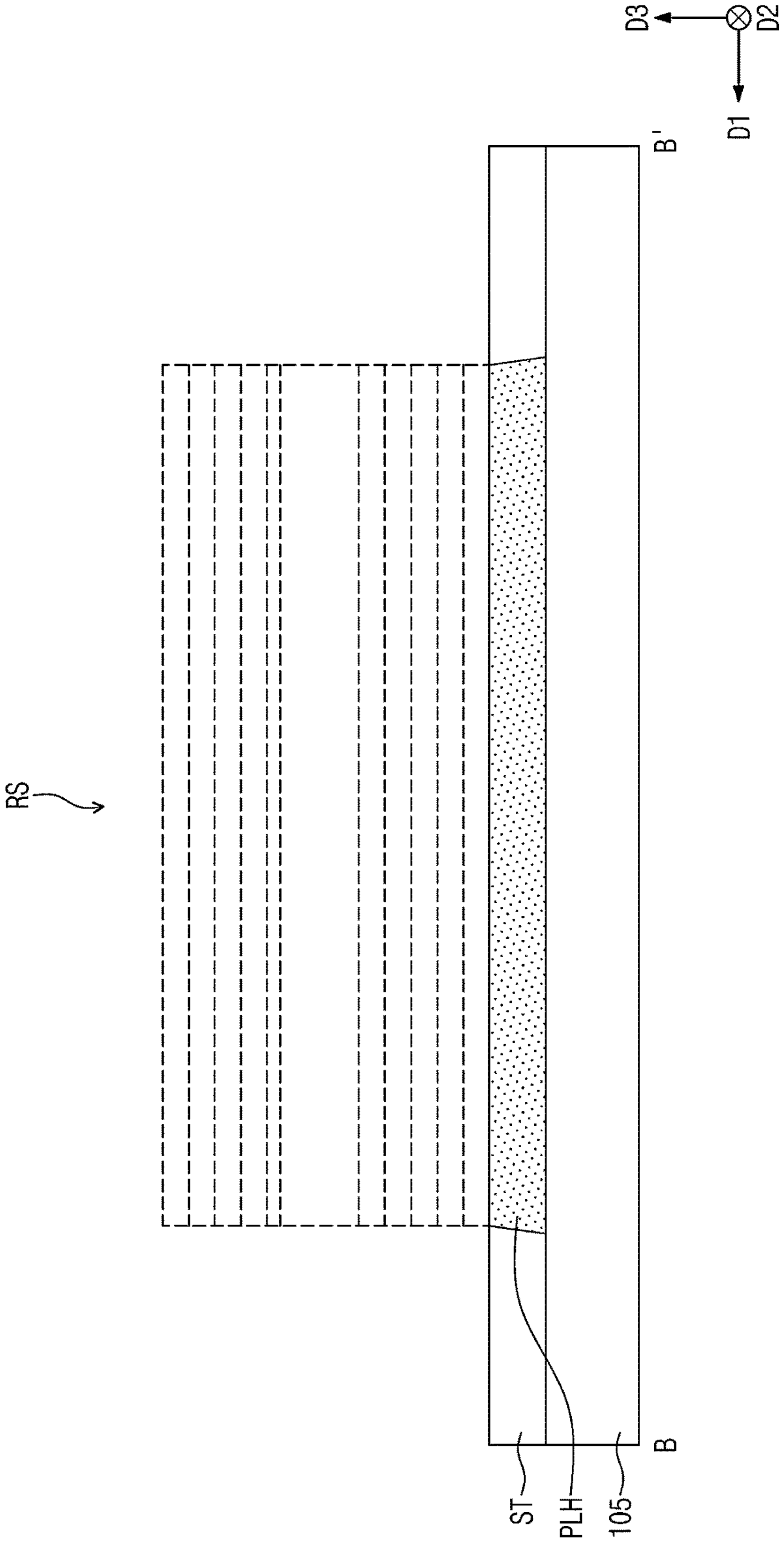
Figure 8C:
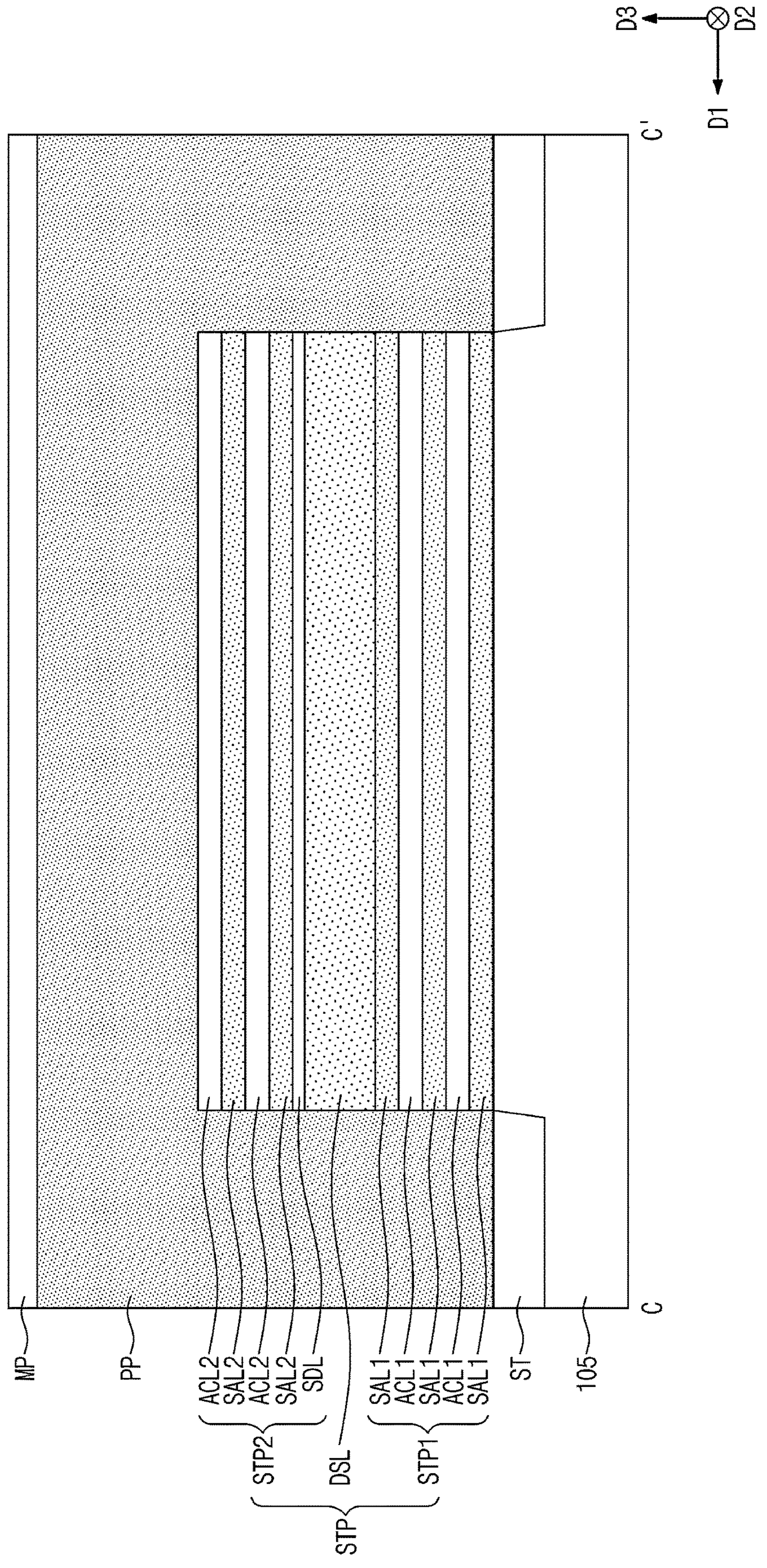
Figure 8D:
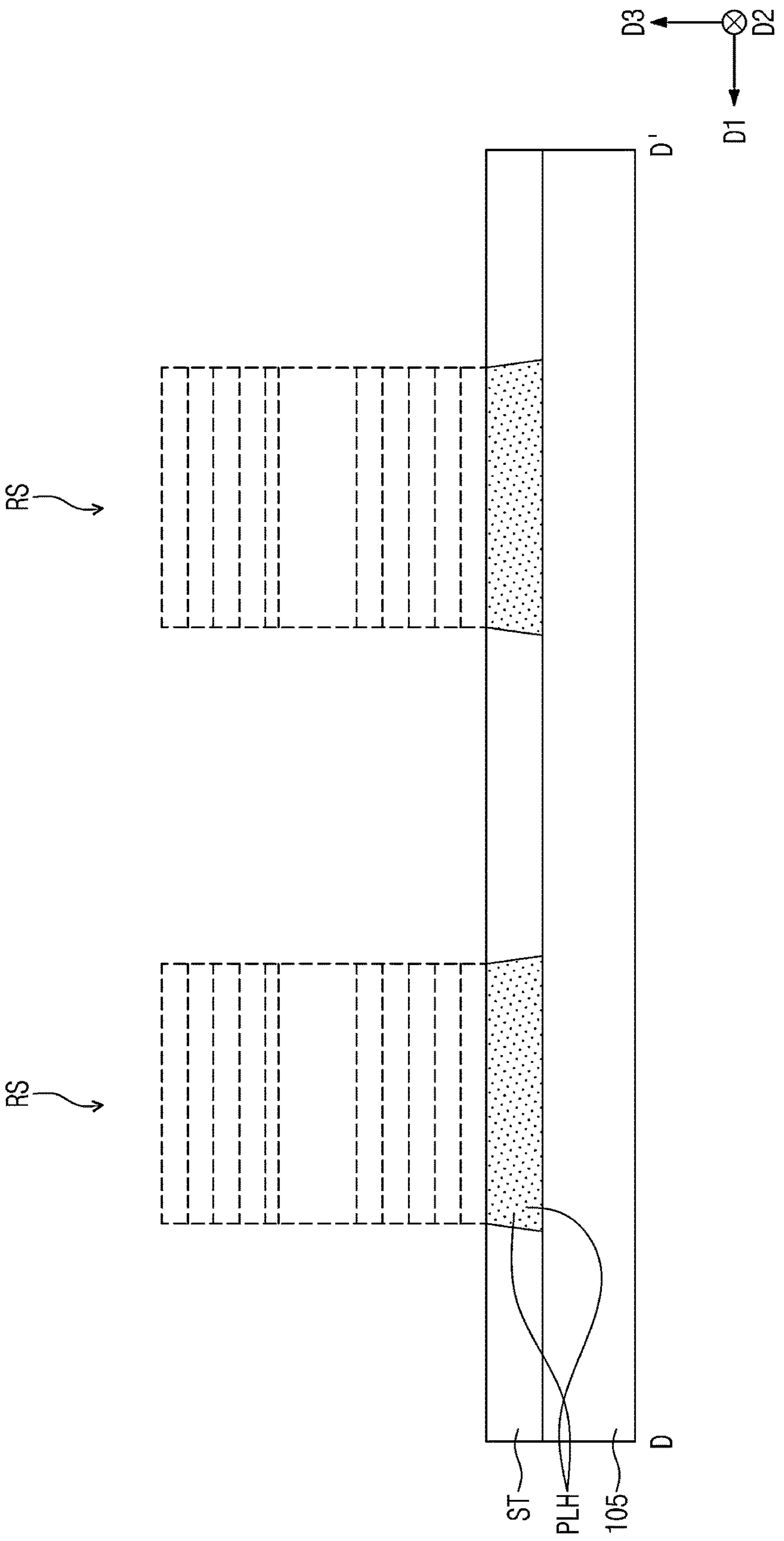
Figure 8E:
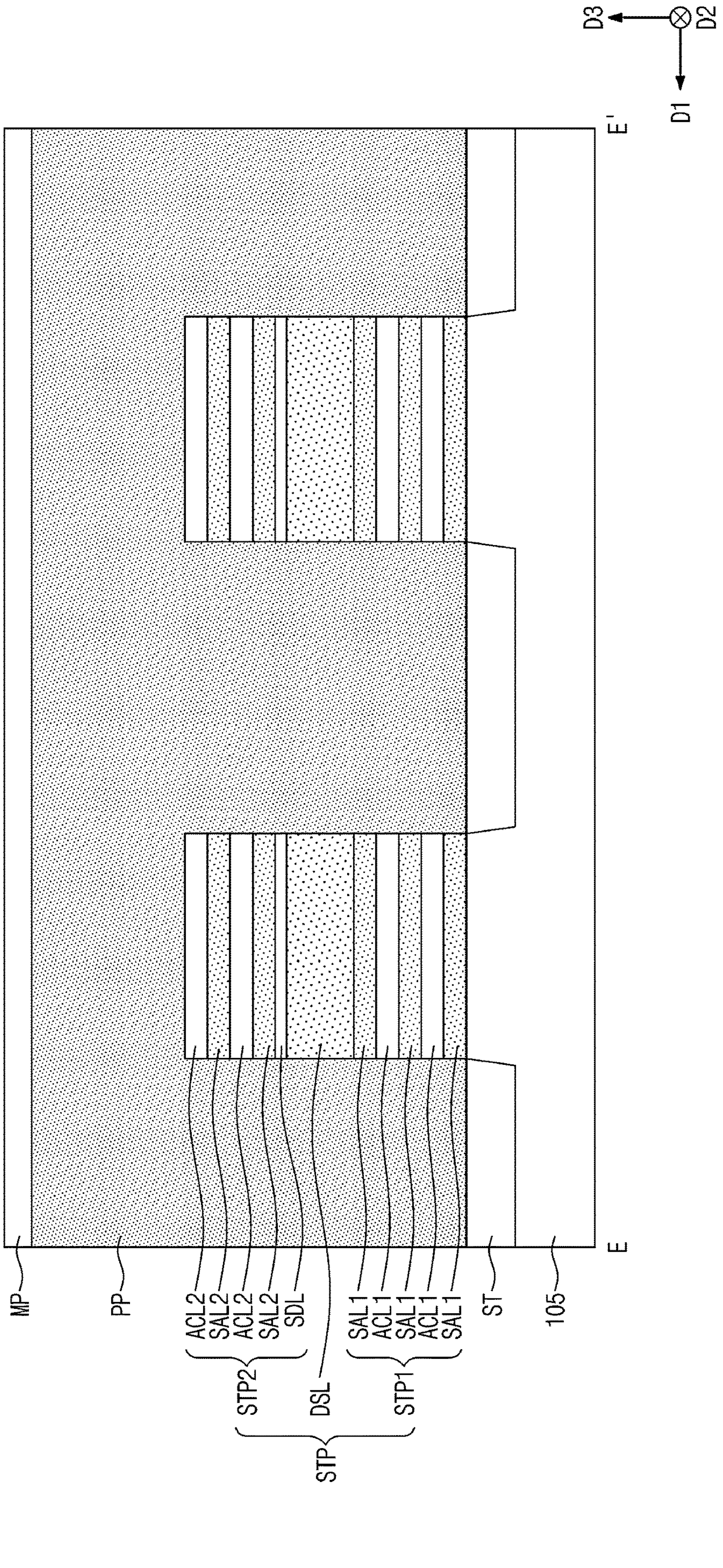

Referring to FIGS. 7A to 7C, a semiconductor substrate 105 may be provided which includes a first region RG1, a second region RG2, and a third region RG3. The semiconductor substrate 105 may be formed of and/or include one of silicon (Si), germanium (Ge), and silicon-germanium (SiGe). For example, the semiconductor substrate 105 may be a monocrystalline silicon wafer.

First sacrificial layers SAL1 and first active layers ACL1 may be alternately stacked on the semiconductor substrate 105. The first sacrificial layers SAL1 may be formed of and/or include one of silicon (Si), germanium (Ge), and silicon-germanium (SiGe), and the first active layers ACL1 may be formed of and/or include one of silicon (Si), germanium (Ge), and silicon-germanium (SiGe). For example, the first sacrificial layers SAL1 may be formed of and/or include silicon-germanium (SiGe), and the first active layers ACL1 may be formed of and/or include silicon (Si). Each of the first sacrificial layers SAL1 may have a germanium concentration in the range of between 10 at % to 30 at %, where at % is the atomic percentage.

A separation layer DSL may be formed on an uppermost first sacrificial layer SAL1. In an embodiment of the present inventive concepts, the separation layer DSL may have a thickness greater than that of the first sacrificial layer SAL1. The separation layer DSL may be formed of and/or include silicon (Si) or silicon-germanium (SiGe). In embodiments in which the separation layer DSL is formed of and/or includes silicon-germanium (SiGe), the separation layer DSL may have a germanium concentration greater than that of the first sacrificial layer SAL1. For example, the separation layer DSL may have a germanium concentration in the range of 40 at % to 90 at %.

A seed layer SDL may be formed on the separation layer DSL. The seed layer SDL may be formed of and/or include the same material as that of the first active layer ACL1. Second sacrificial layers SAL2 and second active layers ACL2 may be alternately stacked on the seed layer SDL. Each of the second sacrificial layers SAL2 may be formed of and/or include the same material as that of the first sacrificial layer SAL1, and each of the second active layers ACL2 may be formed of and/or include the same material as that of the first active layer ACL1. The separation layer DSL may be interposed between the first sacrificial layer SAL1 and the seed layer SDL.

Referring to FIG. 7B, a stack pattern STP may be formed by patterning the first and second sacrificial layers SAL1 and SAL2, the first and second active layers ACL1 and ACL2, and the separation layer DSL that are stacked on each other. The formation of the stack pattern STP may include forming a hardmask pattern on an uppermost second active layer ACL2, and using the hardmask pattern as an etching mask to etch the stacked layers SAL1, SAL2, ACL1, ACL2, SDL, and DSL on the semiconductor substrate 105. During the formation of the stack pattern STP, an upper portion of the semiconductor substrate 105 may be patterned to form a trench TR that defines a single height cell SHC. The stack pattern STP may have a bar or linear shape that extends in a second direction D2.

The stack pattern STP may include a lower stack pattern STP1 on the semiconductor substrate 105, an upper stack pattern STP2 on the lower stack pattern STP1, and the separation layer DSL between the lower and upper stack patterns STP1 and STP2. The lower stack pattern STP1 may include the first sacrificial layers SAL1 and the first active layers ACL1 that are alternately stacked. The upper stack pattern STP2 may include the seed layer SDL and may also include the second sacrificial layers SAL2 and the second active layers ACL2 that are alternately stacked on the seed layer SDL. A device isolation layer ST filling the trench TR may be formed on the semiconductor substrate 105.

Referring to FIG. 7C, a plurality of stack patterns STP may be provided on the semiconductor substrate 105. The plurality of stack patterns STP may be spaced apart from each other across the device isolation layer ST. For example, the plurality of stack patterns STP may be spaced apart from each other in a first direction D1.

Referring to FIGS. 8A to 8E, a plurality of sacrificial pattern PP may be formed to run across the stack pattern STP. Each of the sacrificial patterns PP may be formed to have a linear shape that extends in the first direction D1. For example, the formation of the sacrificial patterns PP may include forming a sacrificial layer on a front surface of the semiconductor substrate 105, forming a hardmask pattern MP on the sacrificial layer, and using the hardmask pattern MP as an etching mask to pattern the sacrificial layer. The sacrificial layer may be formed of and/or include one or more of amorphous silicon and polysilicon.

A pair of gate spacers GS may be formed on opposite sidewalls of a sacrificial pattern PP. For example, a spacer layer may be conformally formed on the front surface of the semiconductor substrate 105. The spacer layer may cover the sacrificial pattern PP and the hardmask pattern MP. The spacer layer may be formed of and/or include at least one material selected from SiCN, SiCON, and SiN. The spacer layer may be anisotropically etched to form the gate spacers GS.

The gate spacers GS and the hardmask pattern MP may be used as an etching mask to perform an etching process on the stack pattern STP. The etching process may form a recess RS between neighboring sacrificial patterns PP. The recess RS may cause that the stack pattern STP is formed to have a vertical rod shape.

Sacrificial contact patterns PLH may be formed in the semiconductor substrate 105 exposed through the recess RS. The sacrificial contact patterns PLH may be formed to have a contact shape. The sacrificial contact patterns PLH may be arranged along the second direction D2. The sacrificial contact patterns PLH may be formed of and/or include a material, such as silicon-germanium (SiGe), having an etch selectivity with respect to the semiconductor substrate 105. The sacrificial contact patterns PLH may be formed by an epitaxial growth process. The recess RS may expose the sacrificial contact pattern PLH. For example, the recess RS may overlap the sacrificial contact pattern PLH.

In some embodiments the previously described separation layer DSL that includes silicon-germanium (SiGe) may be replaced with a silicon-based dielectric material. The separation layer DSL exposed by the recess RS may be selectively removed, and a region where the separation layer DSL is removed may be filled with a silicon-based dielectric material (e.g., silicon nitride).

Referring to FIGS. 9A to 9C, a first lower source/drain pattern LSD1 and a second lower source/drain pattern LSD2 may be formed in the recess RS. For example, the first and second lower source/drain patterns LSD1 and LSD2 may be formed by performing a first selective epitaxial growth (SEG) process that uses a seed layer or a sidewall of the lower stack pattern STP1 exposed by the recess RS. The first and second lower source/drain patterns LSD1 and LSD2 may be grown from the first active layers ACL1 exposed by the recess RS. For example, the first SEG process may include chemical vapor deposition (CVD) or molecular beam epitaxy (MBE).

During the first SEG process, impurities may be in-situ doped into the first and second lower source/drain patterns LSD1 and LSD2. Alternatively, after the formation of the first and second lower source/drain patterns LSD1 and LSD2, impurities may be implanted into the first and second lower source/drain patterns LSD1 and LSD2. The first and second lower source/drain patterns LSD1 and LSD2 may be doped to have a first conductivity type (e.g., n-type).

First active layers ACL1 that correspondingly interposed between a pair of first and second lower source/drain patterns LSD1 and LSD2 may constitute a first lower channel pattern LCH1 and a second lower channel pattern LCH2. For example, the first active layers ACL1 may be formed into first and second semiconductor patterns SP1 and SP2 of the first lower channel pattern LCH1. The first active layers ACL1 may be formed into fifth and sixth semiconductor patterns SP5 and SP6 of the second lower channel pattern LCH2. On the first region RG1, the first lower channel patterns LCH1 and the first lower source/drain patterns LSD1 may constitute a first active section AR1 as a bottom tier of a three-dimensional device. On the third region RG3, the second lower channel pattern LCH2 and the second lower source/drain patterns LSD2 may constitute a fifth active section AR5 as a bottom tier of a three-dimensional device.

The first and second lower source/drain patterns LSD1 and LSD2 may each be formed to completely fill a space between a pair of first and second lower channel patterns LCH1 and LCH2. For example, the first SEG process may be performed for a sufficient time until the first and second lower source/drain patterns LSD1 and LSD2 fill a space between a pair of first and second lower channel patterns LCH1 and LCH2 and connect the pair of first and second lower channel patterns LCH1 and LCH2 to each other.

A first interlayer dielectric layer 110 may be formed to cover the first and second lower source/drain patterns LSD1 and LSD2. For example, before the formation of the first interlayer dielectric layer 110, an etch stop layer may further be formed to conformally cover the first and second lower source/drain patterns LSD1 and LSD2. For example, before the formation of the first and second lower source/drain patterns LSD1 and LSD2, a portion of the first interlayer dielectric layer 110 may be first formed below the first and second lower source/drain patterns LSD1 and LSD2, and after the formation of the first and second lower source/drain patterns LSD1 and LSD2, another portion of the first interlayer dielectric layer 110 may further be formed.

In the recess RS, the first interlayer dielectric layer 110 may cover a sidewall of the upper stack pattern STP2. Afterwards, an upper portion of the first interlayer dielectric layer 110 may be removed to re-expose the sidewall of the upper stack pattern STP2 in the recess RS. First and second upper source/drain patterns USD1 and USD2 may be formed on the exposed sidewall of the upper stack pattern STP2. For example, a second SEG process may be performed in which the sidewall of the upper stack pattern STP2 exposed by the recess RS is used as a seed layer to form the first and second upper source/drain patterns USD1 and USD2. The first and second upper source/drain patterns USD1 and USD2 may be grown from seeds or the second active layers ACL2 exposed by the recess RS. The first and second upper source/drain patterns USD1 and USD2 may be doped to have a second conductivity type (e.g., p-type) different from the first conductivity type.

The second active layers ACL2 each interposed between a pair of first and second upper source/drain patterns USD1 and USD2 may constitute first or second upper channel patterns UCH1 or UCH2. For example, the second active layers ACL2 may be formed into third and fourth semiconductor patterns SP3 and SP4 of the first upper channel pattern UCH1. The second active layers ACL2 may be formed into seventh and eighth semiconductor patterns SP7 and SP8 of the second upper channel pattern UCH2. On the first region RG1, the first upper channel patterns UCH1 and the first upper source/drain patterns USD1 may constitute a second active section AR2 as a top tier of a three-dimensional device. On the third region RG3, the second upper channel patterns UCH2 and the second upper source/drain patterns USD2 may constitute a sixth active section AR6 as a bottom tier of a three-dimensional device. The second SEG process may be performed for a sufficient time to allow the first and second upper source/drain patterns USD1 and USD2 to completely fill a space between a pair of first and second upper channel patterns UCH1 and UCH2.

A second interlayer dielectric layer 120 may be formed to cover the first and second upper source/drain patterns USD1 and USD2. For example, before the formation of the second interlayer dielectric layer 120, an etch stop layer may further be formed to conformally cover the first and second upper source/drain patterns USD1 and USD2.

After that, the second interlayer dielectric layer 120 may be planarized until a top surface of the sacrificial pattern PP is exposed. An etch-back or chemical mechanical polishing (CMP) process may be employed to planarize the second interlayer dielectric layer 120. The hardmask pattern MP on the sacrificial pattern PP may be removed during the planarization process. As a result, a top surface of the second interlayer dielectric layer 120 may be substantially coplanar with that of the sacrificial pattern PP and those of the gate spacers GS.

Referring to FIGS. 10A to 10E, the exposed sacrificial pattern PP may be selectively removed. The removal of the sacrificial pattern PP may include performing a wet etching process using an etchant that selectively etches polysilicon. The removal of the sacrificial pattern PP may expose the first and second sacrificial layers SAL1 and SAL2.

The first region RG1 may undergo an etching process in which the first and second sacrificial layers SAL1 and SAL2 are selectively etched, such that only the first and second sacrificial layers SAL1 and SAL2 may be removed while leaving the first to fourth semiconductor patterns SP1 to SP4 and the dummy channel pattern DSP. The third region RG3 may undergo an etching process in which the first and second sacrificial layers SAL1 and SAL2 are selectively etched, such that only the first and second sacrificial layers SAL1 and SAL2 may be removed while leaving the fifth to twelfth semiconductor patterns SP5 to SP12 and the first and second dummy channel patterns DSP1 and DSP2.

The etching process may have a high etch rate with respect to silicon-germanium. For example, the etching process may have a high etch rate with respect to silicon-germanium in which the germanium concentration is greater than 10 at %.

A gate dielectric layer GI may be conformally formed in a region where the sacrificial pattern PP and the first and second sacrificial layers SAL1 and SAL2 are removed. A gate electrode GE may be formed on the gate dielectric layer GI. The formation of the gate electrode GE may include forming first to fifth inner electrodes PO1 to PO5 between the first to fourth semiconductor patterns SP1 to SP4, and forming an outer electrode PO6 in a region where the sacrificial pattern PP is removed. Before or after the formation of the gate electrode GE, a cutting pattern CT may further be formed in a region where the sacrificial pattern PP is removed.

The gate electrode GE may be recessed to have a reduced height. A gate capping pattern GP may be formed on the recessed gate electrode GE. The gate capping pattern GP may undergo a planarization process to allow the gate capping pattern GP to have a top surface coplanar with that of the second interlayer dielectric layer 120. A third interlayer dielectric layer 130 may be formed to cover the gate electrode GE and the second interlayer dielectric layer 120.

Referring back to FIGS. 3 and 4A to 4E, first, second, and third upper active contacts UAC1, UAC2, and UAC3 may be formed to penetrate through the third interlayer dielectric layer 130 and a portion of the second interlayer dielectric layer 120. A fourth interlayer dielectric layer 140 may be formed on the first to third upper active contacts UAC1 to UAC3 and the third interlayer dielectric layer 130. A first metal layer M1 including upper lines UMI may be formed in the fourth interlayer dielectric layer 140. Upper vias UVI may be formed to electrically connect the first metal layer M1 to the gate contacts GC and the upper active contacts UAC. A back-end-of-line (BEOL) layer including additional layers (e.g., M2, M3, M4, etc.) may be formed on the first metal layer M1.

Thereafter, the semiconductor substrate 105 may be turned upside down (i.e., inverted) to expose a rear surface of the semiconductor substrate 105. The exposed semiconductor substrate 105 may be selectively removed. Thus, the sacrificial contact patterns PLH may be exposed.

A lower dielectric layer may be formed on the exposed sacrificial contact patterns PLH. For example, the lower dielectric layer may be formed of a silicon-based dielectric material (e.g., silicon oxide, silicon oxynitride, or silicon nitride). In an embodiment, the lower dielectric layer may be formed of the same material as the device isolation layer ST.

The lower dielectric layer may constitute a substrate 100. The substrate 100 may have a first surface 100*a* and a second surface 100*b*. A planarization process may be performed on the second surface 100*b* of the substrate 100 until top surfaces of the sacrificial contact patterns PLH are exposed.

The sacrificial contact pattern PLH may be replaced with a lower active contact LAC. For example, the sacrificial contact pattern PLH may be selectively removed. An etching process may further be performed on a region where the sacrificial contact pattern PLH is removed, such that the first and second lower source/drain patterns LSD1 and LSD2 are exposed. The lower active contact LAC may be formed coupled to the exposed first and second lower source/drain patterns LSD1 and LSD2. The lower active contact LAC may be formed in a self-alignment manner where the sacrificial contact pattern PLH is used.

A lower interlayer dielectric layer 210 may be formed on the second surface 100*b* of the substrate 100. A backside metal layer BSM may be formed in the lower interlayer dielectric layer 210. The backside metal layer BSM may include lower lines LMI. A lower via LVI may be formed to electrically connect the backside metal layer BSM to the lower active contact LAC. In an embodiment, the lower via LVI may be formed to connect the lower active contact LAC to the lower lines LMI. Additional backside metal layers may be formed on the backside metal layer BSM. In an embodiment of the present inventive concepts, the additional backside metal layers may include a power delivery network.

In a three-dimensional semiconductor device according to the present inventive concepts, an active contact, a gate electrode, and a nano-sheet on a logic cell may be formed to extend in a first direction. Thus, an effective channel width of the nano-sheet may be increased to improve electrical properties of the device.

In a three-dimensional semiconductor device according to the present inventive concepts, there may be provided one active contact connected to source/drain patterns on a double height cell. As the active contact extends to contact a plurality of source/drain patterns, the size of a dummy region between ordinary logic cells may be decreased to increase integration of the device.

Although some embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

What is claimed is:

1. A three-dimensional semiconductor device, comprising:

a substrate that includes a first region and a second region;

a first active section on the first region, wherein the first active section includes a first lower channel pattern and a first lower source/drain pattern connected to the first lower channel pattern;

a second active section on the first active section, wherein the second active section includes a first upper channel pattern and a first upper source/drain pattern connected to the first upper channel pattern;

a third active section on the second region, wherein the third active section includes a second lower channel pattern and a second lower source/drain pattern connected to the second lower channel pattern;

a fourth active section on the third active section, wherein the fourth active section includes a second upper channel pattern and a second upper source/drain pattern connected to the second upper channel pattern; and a gate electrode on the first and second lower channel patterns and the first and second upper channel patterns, wherein a first width in a first direction of the first lower channel pattern is greater than a second width in the first direction of the second lower channel pattern.

2. The device of claim 1, wherein the first width is 1.5 times to 2.5 times the second width.

3. The device of claim 1, wherein a third width in the first direction of the first upper channel pattern is the same as the first width.

4. The device of claim 1, wherein a fourth width in the first direction of the second upper channel pattern is the same as the second width.

5. The device of claim 1, wherein a third width in the first direction of the first upper channel pattern is the same as the first width, a fourth width in the first direction of the second upper channel pattern is the same as the second width, and the third width is greater than the fourth width.

6. The device of claim 5, wherein the third width is 1.5 times to 2.5 times the fourth width.

7. The device of claim 1, further comprising:

a lower active contact electrically connected to the first lower source/drain pattern; and a first upper active contact electrically connected to the first upper source/drain pattern.

8. The device of claim 7, further comprising:

an upper line on the first upper active contact; and a lower line below the lower active contact, wherein the upper line is electrically connected to the first upper active contact, and wherein the lower line is electrically connected to the lower active contact.

9. The device of claim 1, wherein each of the first and second lower channel patterns and the first and second upper channel patterns includes a plurality of semiconductor patterns that are stacked while being vertically spaced apart from each other, and the gate electrode surrounds the plurality of semiconductor patterns.

10. The device of claim 1, further comprising a dummy channel pattern between the first lower channel pattern and the first upper channel pattern, wherein the dummy channel pattern is spaced apart from the first lower source/drain pattern and the first upper source/drain pattern.

11. The device of claim 10, further comprising a seed layer on the dummy channel pattern, wherein the seed layer is between the dummy channel pattern and the first upper channel pattern.

12. A three-dimensional semiconductor device, comprising:

a first active section on a substrate, wherein the first active section includes a first lower channel pattern, a second lower channel pattern horizontally spaced apart from the first lower channel pattern, a first lower source/drain pattern connected to the first lower channel pattern, and a second lower source/drain pattern connected to the second lower channel pattern;

a second active section on the first active section, wherein the second active section includes a first upper channel pattern, a second upper channel pattern horizontally spaced apart from the first upper channel pattern, a first upper source/drain pattern connected to the first upper channel pattern, and a second upper source/drain pattern connected to the second upper channel pattern;

a gate electrode on the first and second lower channel patterns and the first and second upper channel patterns;

a lower active contact electrically connected to the first and second lower source/drain patterns; and a first upper active contact electrically connected to the first and second upper source/drain patterns, wherein the first upper active contact has a bar shape that extends in a first direction, and wherein a width in the first direction of the first upper active contact is greater than a maximum width of each of the first and second upper source/drain patterns.

13. The device of claim 12, wherein the lower active contact includes:

a horizontal part that extends in the first direction; and a protruding part in contact with each of the first and second lower source/drain patterns.

14. The device of claim 13, wherein a width in the first direction of the horizontal part is greater than a maximum width of each of the first and second lower source/drain patterns.

15. The device of claim 12, wherein each of the first and second lower channel patterns and the first and second upper channel patterns includes a plurality of semiconductor patterns that are stacked while being vertically spaced apart from each other, and the gate electrode surrounds the plurality of semiconductor patterns.

16. The device of claim 12, further comprising:

a first dummy channel pattern between the first lower channel pattern and the first upper channel pattern; and a second dummy channel pattern between the second lower channel pattern and the second upper channel pattern, wherein the first dummy channel pattern is spaced apart from the first lower source/drain pattern and the first upper source/drain pattern, and wherein the second dummy channel pattern is spaced apart from the second lower source/drain pattern and the second upper source/drain pattern.

17. A three-dimensional semiconductor device, comprising:

a substrate that includes a first region, a second region, and a third region;

a first single height cell on the first region, wherein the first single height cell includes a first active section and a second active section stacked on the first active section;

a plurality of second single height cells on the second region and a dummy region between the plurality of second single height cells, wherein each of the plurality of second single height cells includes a third active section and a fourth active section stacked on the third active section;

a double height cell on the third region, wherein the double height cell includes a fifth active section, a sixth active section stacked on the fifth active section, a seventh active section, and an eight active section stacked on the seventh active section;

a plurality of first gate electrodes on the first and second active sections, wherein each of the plurality of first gate electrodes has a bar shape that extends in a first direction;

a first upper active contact between the plurality of first gate electrodes, wherein the first upper active contact has a bar shape that extends in the first direction;

a plurality of second gate electrodes on the third and fourth active sections, wherein each of the plurality of second gate electrodes has a bar shape that extends in the first direction;

a second upper active contact between the plurality of second gate electrodes, wherein the second upper active contact has a bar shape that extends in the first direction;

a plurality of third gate electrodes on the fifth and sixth active sections, wherein each of the plurality of third gate electrodes has a bar shape that extends in the first direction; and a third upper active contact between the plurality of third gate electrodes, wherein the third upper active contact has a bar shape that extends in the first direction, wherein a first height in the first direction of the first single height cell is in the range of 1.5 times to 2.5 times a second height in the first direction of the second single height cell.

18. The device of claim 17, wherein a width in the first direction of the second upper active contact is less than a width in the first direction of the first upper active contact and is less than a width in the first direction of the third upper active contact.

19. The device of claim 18, wherein the width in the first direction of the first upper active contact is the same as the width in the first direction of the third upper active contact.

20. The device of claim 17, wherein each of the first, third, and fifth active sections includes a lower channel pattern and a lower source/drain pattern connected to the lower channel pattern of the respective active section, each of the second, fourth, and sixth active sections includes an upper channel pattern and an upper source/drain pattern connected to the upper channel pattern of the respective active section, each lower channel pattern and each upper channel pattern includes a plurality of semiconductor patterns that are stacked and vertically spaced apart from an adjacent semiconductor pattern, and each of the first to third gate electrodes surrounds a respective plurality of semiconductor patterns of one of the lower channel patterns and the upper channel patterns.

* * * * *